(12) United States Patent
Lin et al.

(10) Patent No.: US 10,984,211 B1
(45) Date of Patent: Apr. 20, 2021

(54) SEMICONDUCTOR DEVICE WITH BIOFET AND BIOMETRIC SENSORS

(71) Applicant: Taiwan Semiconductor Manufacturing Co., Ltd., Hsinchu (TW)

(72) Inventors: Ching-Hui Lin, Taichung (TW); Chun-Ren Cheng, Hsin-Chu (TW); Shih-Fen Huang, Jhubei (TW); Fu-Chun Huang, Zhibei (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

(21) Appl. No.: 16/656,882

(22) Filed: Oct. 18, 2019

(51) Int. Cl.
*G06K 9/00* (2006.01)
*H01L 41/113* (2006.01)
*G01N 27/414* (2006.01)

(52) U.S. Cl.
CPC ....... *G06K 9/0002* (2013.01); *G01N 27/4145* (2013.01); *H01L 41/1132* (2013.01)

(58) Field of Classification Search
CPC .............. G06K 9/0002; H01L 41/1132; G01N 27/4145
USPC ......................................................... 216/13
See application file for complete search history.

(56) References Cited

U.S. PATENT DOCUMENTS

| | | | | |
|---|---|---|---|---|
| 6,234,031 | B1* | 5/2001 | Suga | G06K 9/0002 73/862.474 |
| 7,013,031 | B2* | 3/2006 | Kim | G06K 9/0002 257/419 |
| 2008/0220557 | A1* | 9/2008 | Mainguet | G11C 11/22 438/54 |
| 2016/0334362 | A1* | 11/2016 | Liu | H01L 23/345 |
| 2019/0294845 | A1* | 9/2019 | De Foras | G06K 9/0002 |

* cited by examiner

*Primary Examiner* — Duy Vu N Deo
(74) *Attorney, Agent, or Firm* — Sterne, Kessler, Goldstein & Fox P.L.L.C.

(57) ABSTRACT

The structure of a semiconductor device with an array of bioFET sensors, a biometric fingerprint sensor, and a temperature sensor and a method of fabricating the semiconductor device are disclosed. A method for fabricating the semiconductor device includes forming a gate electrode on a first side of a semiconductor substrate, forming a channel region between source and drain regions within the semiconductor substrate, and forming a piezoelectric sensor region on a second side of the semiconductor substrate. The second side is substantially parallel and opposite to the first side. The method further includes forming a temperature sensing electrode on the second side during the forming of the piezoelectric sensor region, forming a sensing well on the channel region, and binding capture reagents on the sensing well.

20 Claims, 19 Drawing Sheets

SEMICONDUCTOR DEVICE WITH BIOFET AND BIOMETRIC SENSORS

BACKGROUND

Biosensor systems can be used for sensing and detecting biomolecules and can operate on the basis of electronic, electrochemical, optical, and/or mechanical detection principles. Biosensor systems with field effect transistors (FETs) can electrically sense charges, photons, and/or mechanical properties of bio-entities or biomolecules. The detection can be performed by detecting the bio-entities or biomolecules themselves, or through interaction and reaction between specified reactants and bio-entities/biomolecules. Such biosensor systems can be manufactured using semiconductor processes, can quickly convert electric signals, and can be easily applied to integrated circuits (ICs) and microelectromechanical systems (MEMS).

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
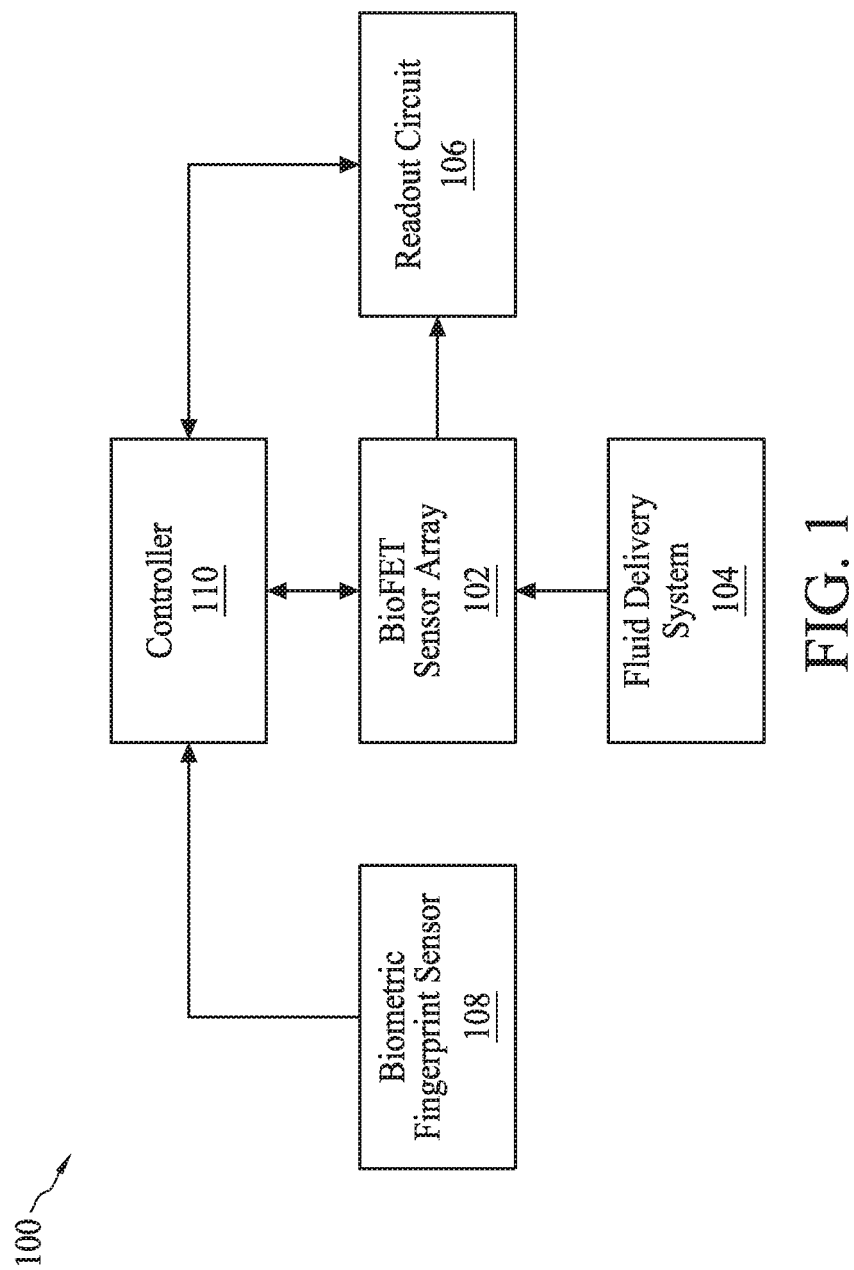
FIG. 1 illustrates components of a sensor system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows can include embodiments in which the first and second features are formed in direct contact, and can also include embodiments in which additional features can be formed between the first and second features, such that the first and second features may not be in direct contact. As used herein, the formation of a first feature on a second feature means the first feature is formed in direct contact with the second feature. In addition, the present disclosure can repeat reference numerals and/or letters in the various examples. This repetition does not in itself dictate a relationship between the various embodiments and/or configurations discussed.

Spatially relative terms, such as "beneath," "below," "lower," "above," "upper," and the like can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

It is noted that references in the specification to "one embodiment," "an embodiment," "an example embodiment," "exemplary," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

Terminology

Unless defined otherwise, all technical and scientific terms used herein have the same meanings as commonly understood by one of ordinary skill in the art to which this disclosure belongs. Although any methods and materials similar or equivalent to those described herein can be used in the practice or testing of embodiments in accordance with the disclosure; the methods, devices, and materials are now described. All patents and publications mentioned herein are incorporated herein by reference for the purpose of describing and disclosing the materials and methodologies that are reported in the publications can be used in connection with the present disclosure.

The acronym "FET," as used herein, refers to a field effect transistor. A type of FET is referred to as a "metal oxide semiconductor field effect transistor" (MOSFET). MOSFETs can be planar structures built in and on the planar surface of a substrate such as a semiconductor wafer. MOSFETs can also have a three-dimensional, fin-based structures.

The term "bioFET" (also referred to as "bioFET sensor") refers to a FET that includes a layer of capture reagents that act as surface receptors to detect the presence of a target analyte of biological origin. A bioFET is a field-effect sensor with a semiconductor transducer, according to some embodiments. One advantage of bioFETs is the prospect of label-free operation. Specifically, bioFETs enable the avoidance of costly and time-consuming labeling operations such as the labeling of an analyte with, for instance, fluorescent or radioactive probes. One specific type of bioFET described herein is a "dual-gate back-side sensing bioFET." The analytes for detection by a bioFET can be of biological origin, such as proteins, carbohydrates, lipids, tissue fragments, or portions thereof. A bioFET can be part of a broader genus of FET sensors that can also detect a chemical compound; this type of bioFET is known as a "ChemFET") or any other element. A bioFET can also detect ions such as protons or metallic ions; this type of bioFET is known as an "ISFET." The present disclosure applies to all types of FET-based sensors ("FET Sensors"). One specific type of FET Sensor described herein is a "Dual-Gate Back Side Sensing FET Sensor" (DG BSS FET Sensor).

The term "source/drain" refers to the source/drain junctions that form two of the four terminals of a FET.

The term "high-k" refers to a high dielectric constant. In the field of semiconductor device structures and manufacturing processes, high-k refers to a dielectric constant that is greater than the dielectric constant of SiO2 (i.e., greater than 3.9).

The term "vertical," as used herein, means nominally perpendicular to the surface of a substrate.

The term "etch selectivity" refers to the ratio of the etch rates of two different materials under the same etching conditions.

The term "p-type" defines a structure, layer, and/or region as being doped with p-type dopants, such as boron.

The term "n-type" defines a structure, layer, and/or region as being doped with n-type dopants, such as phosphorus.

In some embodiments, the terms "about" and "substantially" can indicate a value of a given quantity that varies within 5% of the value (e.g., ±1%, ±2%, ±3%, ±4%, ±5% of the value).

In some embodiments, the term "analysis" refers to a process or step involving physical, chemical, biochemical, or biological analysis that includes, but is not limited to, characterization, testing, measurement, optimization, separation, synthesis, addition, filtration, dissolution, or mixing.

In some embodiments, the term "assay" refers to a process or step involving the analysis of a chemical or a target analyte and includes, but is not limited to, cell-based assays, biochemical assays, high-throughput assays and screening, diagnostic assays, pH determination, nucleic acid hybridization assays, polymerase activity assays, nucleic acid and protein sequencing, immunoassays (e.g., antibody-antigen binding assays, ELISAs, and iqPCR), bisulfate methylation assays for detecting methylation pattern of genes, protein assays, protein binding assays (e.g., protein-protein, protein-nucleic acid, and protein-ligand binding assays), enzymatic assays, coupled enzymatic assays, kinetic measurements (e.g., kinetics of protein folding and enzymatic reaction kinetics), enzyme inhibitor and activator screening, chemiluminescence and electrochemiluminescence assays, fluorescent assays, fluorescence polarization and anisotropy assays, absorbance and colorimetric assays (e.g., Bradford assay, Lowry assay, Hartree-Lowry assay, Biuret assay, and BCA assay), chemical assays (e.g., for the detection of environmental pollutants and contaminants, nanoparticles, or polymers), and drug discovery assays, whole genome analysis, genome typing analysis, genomic, exome analysis, micro-biome analysis, and clinical analysis including, but not limited to, cancer analysis, non-invasive prenatal testing (NIPT) analysis, and/or UCS analysis. The apparatus, systems, and methods described herein can use or adopt one or more of these assays to be used with any of the FET Sensor described designs.

In some embodiments, the term "liquid biopsy" refers to a biopsy sample obtained from a subject's bodily fluid as compared to a subject's tissue sample. The ability to perform assays using a body fluid sample is oftentimes more desirable than using a tissue sample. The less invasive approach using a body fluid sample has wide ranging implications in terms of patient welfare, the ability to conduct longitudinal disease monitoring, and the ability to obtain expression profiles even when tissue cells are not easily accessible, for example, in the prostate gland. Assays used to detect target analytes in liquid biopsy samples include, but are not limited to, those described above. As a non-limiting example, a circulating tumor cell (CTC) assay can be conducted on a liquid biopsy sample.

For example, a capture reagent (e.g., an antibody) immobilized on a FET Sensor can be used for detection of a target analyte (e.g., a tumor cell marker) in a liquid biopsy sample using a CTC assay. CTCs are cells that have shed into the vasculature from a tumor and circulate, for example, in the bloodstream. Generally CTCs are present in circulation in low concentrations. To assay the CTCs, CTCs are enriched from patient blood or plasma by various techniques known in the art. CTCs can be stained for specific markers using methods known in the art including, but not limited to, cytometry (e.g., flow cytometry)-based methods and IHC-based methods. For the apparatus, systems, and methods described herein, CTCs can be captured or detected using a capture reagent or the nucleic acids, proteins, or other cellular milieu from the CTCs can be targeted as target analytes for binding to or detection by a capture reagent.

When a target analyte is detected on or from a CTC, for example, an increase in target analyte expressing or containing CTCs can help identify the subject as having a cancer that is likely to respond to a specific therapy (e.g., one associated with a target analyte) or allow for optimization of a therapeutic regimen with, for example, an antibody to the target analyte. CTC measurement and quantitation can provide information on, for example, the stage of tumor, response to therapy, disease progression, or a combination thereof. The information obtained from detecting the target analyte on the CTC can be used, for example, as a prognostic, predictive, or pharmacodynamic biomarker. In addition, CTCs assays for a liquid biopsy sample can be used either alone or in combination with additional tumor marker analysis of solid biopsy samples.

In some embodiments, the term "identification" refers to the process of determining the identity of a target analyte based on its binding to a capture reagent whose identity is known.

In some embodiments, the term "measurement" refers to the process of determining the amount, quantity, quality, or property of a target analyte based on its binding to a capture reagent.

In some embodiments, the term "quantitation" refers to the process of determining the quantity or concentration of a target analyte based on its binding to a capture reagent.

In some embodiments, the term "detection" refers to the process of determining the presence or absence of a target analyte based on its binding to a capture reagent. Detection includes but is not limited to identification, measurement, and quantitation.

In some embodiments, the term "chemical" refers to a substance, compound, mixture, solution, emulsion, dispersion, molecule, ion, dimer, macromolecule such as a polymer or protein, biomolecule, precipitate, crystal, chemical moiety or group, particle, nanoparticle, reagent, reaction product, solvent, or fluid any one of which can exist in the solid, liquid, or gaseous state, and which can be the subject of an analysis.

In some embodiments, the term "reaction" refers to a physical, chemical, biochemical, or biological transformation that involves at least one chemical and that generally involves (in the case of chemical, biochemical, and biological transformations) the breaking or formation of one or more bonds such as covalent, noncovalent, van der Waals, hydrogen, or ionic bonds. The term includes chemical reactions, such as synthesis reactions, neutralization reactions, decomposition reactions, displacement reactions, reduction-oxidation reactions, precipitation, crystallization, combustion reactions, and polymerization reactions, as well as covalent and noncovalent binding, phase change, color change, phase formation, crystallization, dissolution, light emission, changes of light absorption or emissive properties, temperature change or heat absorption or emission, conformational change, and folding or unfolding of a macromolecule such as a protein.

In some embodiments, the term "capture reagent" refers to a molecule or compound capable of binding the target analyte, which can be directly or indirectly attached to a substantially solid material. The capture reagent can be a chemical, and specifically any substance for which there exists a naturally occurring target analyte (e.g., an antibody, polypeptide, DNA, RNA, cell, virus, etc.) or for which a target analyte can be prepared, and the capture reagent can bind to one or more target analytes in an assay. The capture reagent can be non-naturally occurring or naturally-occurring, and if naturally-occurring can be synthesized in vivo or in vitro.

In some embodiments, the term "target analyte" refers to the substance to be detected in the test sample using embodiments of the present disclosure. The target analyte can be a chemical, and specifically any substance for which there exists a naturally occurring capture reagent (e.g., an antibody, polypeptide, DNA, RNA, cell, virus, etc.) or for which a capture reagent can be prepared, and the target analyte can bind to one or more capture reagents in an assay. "Target analyte" also includes any antigenic substances, antibodies, and combinations thereof. The target analyte can include a protein, a peptide, an amino acid, a carbohydrate, a hormone, a steroid, a vitamin, a drug including those administered for therapeutic purposes as well as those administered for illicit purposes, a bacterium, a virus, and metabolites of or antibodies to any of the above substances.

In some embodiments, the term "test sample" refers to the composition, solution, substance, gas, or liquid containing the target analyte to be detected and assayed using embodiments of the present disclosure. The test sample can contain other components besides the target analyte, can have the physical attributes of a liquid, or a gas, and can be of any size or volume, including for example, a moving stream of liquid or gas. The test sample can contain any substances other than the target analyte as long as the other substances do not interfere with the binding of the target analyte with the capture reagent or the specific binding of the first binding member to the second binding member. Examples of test samples include, but are not limited to, naturally-occurring and non-naturally occurring samples or combinations thereof. Naturally-occurring test samples can be synthetic or synthesized. Naturally-occurring test samples include body or bodily fluids isolated from anywhere in or on the body of a subject including, but not limited to, blood, plasma, serum, urine, saliva or sputum, spinal fluid, cerebrospinal fluid, pleural fluid, nipple aspirates, lymph fluid, fluid of the respiratory, intestinal, and genitourinary tracts, tear fluid, saliva, breast milk, fluid from the lymphatic system, semen, cerebrospinal fluid, intra-organ system fluid, ascitic fluid, tumor cyst fluid, amniotic fluid and combinations thereof, and environmental samples such as ground water or waste water, soil extracts, air, and pesticide residues or food-related samples.

Detected substances can include, for example, nucleic acids (including DNA and RNA), hormones, different pathogens (including a biological agent that causes disease or illness to its host, such as a virus (e.g., H7N9 or HIV), a protozoan (e.g., *Plasmodium*-causing malaria), or a bacteria (e.g., *E. coli* or *Mycobacterium tuberculosis*), proteins, antibodies, various drugs or therapeutics or other chemical or biological substances, including hydrogen or other ions, non-ionic molecules or compounds, polysaccharides, small chemical compounds such as chemical combinatorial library members, and the like. Detected or determined parameters can include but are not limited to, for example, pH changes, lactose changes, changing concentration, particles per unit time where a fluid flows over the device for a period of time to detect particles, for example, particles that are sparse, and other parameters.

In some embodiments, the term "immobilized" when used with respect to, for example, a capture reagent, includes substantially attaching the capture reagent at a molecular level to a surface. For example, a capture reagent can be immobilized to a surface of the substrate material using adsorption techniques including non-covalent interactions (e.g., electrostatic forces, van der Waals, and dehydration of hydrophobic interfaces) and covalent binding techniques where functional groups or linkers facilitate attaching the capture reagent to the surface. Immobilizing a capture reagent to a surface of a substrate material can be based upon the properties of the substrate surface, the medium carrying the capture reagent, and the properties of the capture reagent. In some cases, a substrate surface can be first modified to have functional groups bound to the surface. The functional groups can then bind to biomolecules or biological or chemical substances to immobilize them thereon.

In some embodiments, the term "nucleic acid" refers to a set of nucleotides connected to each other via phosphodiester bond and refers to a naturally occurring nucleic acid to which a naturally occurring nucleotide existing in nature is connected, such as DNA including deoxyribonucleotides having any of adenine, guanine, cytosine, and thymine connected to each other and/or RNA including ribonucleotides having any of adenine, guanine, cytosine, and uracil connected to each other. Naturally-occurring nucleic acids include, for example, DNA, RNA, and microRNA (miRNA). In addition, non-naturally occurring nucleotides and non-naturally occurring nucleic acids are within the scope of the nucleic acids of the present disclosure. Examples include cDNA, peptide nucleic acids (PNA), peptide nucleic acids with phosphate groups (PHONA), bridged nucleic acids/locked nucleic acids (BNA/LNA), and morpholino nucleic acids. Further examples include chemically-modified nucleic acids and nucleic acid analogues, such as methylphosphonate DNA/RNA, phosphorothioate DNA/RNA, phosphoramidate DNA/RNA, and 2'-O-methyl DNA/RNA. Nucleic acids include those that can be modified. For example, a phosphoric acid group, a sugar, and/or a base in a nucleic acid can be labeled as necessary. Any substances for nucleic acid labeling known in the art can be used for labeling. Examples thereof include but are not limited to radioactive isotopes (e.g., 32P, 3H, and 14C), DIG, biotin, fluorescent dyes (e.g., FITC, Texas, cy3, cy5, cy7, FAM, HEX, VIC, JOE, Rox, TET, Bodipy493, NBD, and TAMRA), and luminescent substances (e.g., acridinium ester).

Aptamer as used herein refers to oligonucleic acids or peptide molecules that bind to a specific target molecule. The concept of using single-stranded nucleic acids (aptamers) as affinity molecules for protein binding was initially disclosed in Ellington, Andrew D., and Jack W. Szostak, "Selection in vitro of single-stranded DNA molecules that fold into specific ligand-binding structures." Nature 355 (1992): 850-852; Tuerk, Craig, and Larry Gold, "Systematic evolution of ligands by exponential enrichment: RNA ligands to bacteriophage T4 DNA polymerase." Science 249.4968 (1990): 505-510) and is based on the ability of short sequences to fold, in the presence of a target, into unique, three-dimensional structures that bind the target with high affinity and specificity. Ng, Eugene W M, et al. "Pegaptanib, a targeted anti-VEGF aptamer for ocular vascular disease." Nature Reviews, Drug Discovery 5.2 (2006): 123, discloses that aptamers are oligonucleotide ligands that are selected for high-affinity binding to molecular targets.

In some embodiments, the term "protein" refers to a set of amino acids linked together usually in a specific sequence. A protein can be either naturally-occurring or non-naturally occurring. As used herein, the term "protein" includes amino acid sequences, as well as amino acid sequences that have been modified to contain moieties or groups such as sugars, polymers, metal-organic groups, fluorescent or light-emitting groups, moieties or groups that enhance or participate in a process such as intramolecular or intermolecular electron transfer, moieties or groups that facilitate or induce a protein into assuming a particular conformation or series of conformations, moieties or groups that hinder or inhibit a protein from assuming a particular conformation or series of conformations, moieties or groups that induce, enhance, or inhibit protein folding, or other moieties or groups that are incorporated into the amino acid sequence and that are intended to modify the sequence's chemical, biochemical, or biological properties. As used herein, proteins include, but are not limited to, enzymes, structural elements, antibodies, antigen-binding antibody fragments, hormones, receptors, transcription factors, electron carriers, and other macromolecules that are involved in processes such as cellular processes or activities. Proteins can have up to four structural levels that include primary, secondary, tertiary, and quaternary structures.

In some embodiments, the term "antibody" refers to a polypeptide of the immunoglobulin family that is capable of binding a corresponding antigen non-covalently, reversibly, and in a specific manner. For example, a naturally occurring IgG antibody is a tetramer including at least two heavy (H) chains and two light (L) chains inter-connected by disulfide bonds. Each heavy chain includes a heavy chain variable region (abbreviated herein as VH) and a heavy chain constant region. The heavy chain constant region includes three domains, CHL CH2 and CH3. Each light chain includes a light chain variable region (abbreviated herein as VL) and a light chain constant region. The light chain constant region includes one domain, CL. The VH and VL regions can be further subdivided into regions of hypervariability, termed complementarity determining regions (CDR), interspersed with regions that are more conserved, termed framework regions (FR). Each VH and VL is composed of three CDRs and four FRs arranged from amino-terminus to carboxy-terminus in the following order: FR1, CDR1, FR2, CDR2, FR3, CDR3, and FR4. The three CDRs constitute about 15-20% of the variable domains. The variable regions of the heavy and light chains contain a binding domain that interacts with an antigen. The constant regions of the antibodies can mediate the binding of the immunoglobulin to host tissues or factors, including various cells of the immune system (e.g., effector cells) and the first component (C1q) of the classical complement system. (Kuby, Immunology, 4th ed., Chapter 4. W.H. Freeman & Co., New York, 2000).

In some embodiments, the term "antibody" includes, but is not limited to, monoclonal antibodies, human antibodies, humanized antibodies, chimeric antibodies, and anti-idiotypic (anti-Id) antibodies (including, for example, anti-Id antibodies to antibodies of the present disclosure). The antibodies can be of any isotype/class (e.g., IgG, IgE, IgM, IgD, IgA, and IgY), or subclass (e.g., IgG1, IgG2, IgG3, IgG4, IgA1 and IgA2).

In some embodiments, the term "antigen binding fragment" refers to one or more portions of an antibody that retain the ability to specifically interact with (e.g., by binding, steric hindrance, stabilizing/destabilizing, and spatial distribution) an epitope of an antigen. Examples of binding fragments include, but are not limited to, single-chain Fvs (scFv), camelid antibodies, disulfide-linked Fvs (sdFv), Fab fragments, F(ab') fragments, a monovalent fragment consisting of the VL, VH, CL, and CH1 domains; a F(ab)2 fragment, a bivalent fragment including two Fab fragments linked by a disulfide bridge at the hinge region; a Fd fragment consisting of the VH and CH1 domains; a Fv fragment consisting of the VL and VH domains of a single arm of an antibody; a dAb fragment (Ward, E. Sally, et al., "Binding activities of a repertoire of single immunoglobulin variable domains secreted from *Escherichia coli.*" *Nature* 341.6242 (1989): 544-546), which consists of a VH domain; and an isolated complementarity determining region (CDR), or other epitope-binding fragments of an antibody.

Furthermore, although the two domains of the Fv fragment (VL and VH) are coded for by separate genes, they can be joined (using recombinant methods) by a synthetic linker that enables them to be made as a single protein chain, in which the VL and VH regions pair to form monovalent molecules (known as single chain Fv ("scFv"); see, e.g., Bird, Robert E., et al., "Single-chain antigen-binding proteins." *Science* 242.4877 (1988): 423-427; and Huston, James S., et al., "Protein engineering of antibody binding sites: recovery of specific activity in an anti-digoxin single-chain Fv analogue produced in *Escherichia coli.*" *Proceedings of the National Academy of Sciences* 85.16 (1988): 5879-5883). Such single chain antibodies are also intended to be encompassed within the term "antigen binding fragment." These antigen binding fragments are obtained using conventional techniques known to those of skill in the art, and the fragments are screened for utility in the same manner as are intact antibodies.

Antigen binding fragments can also be incorporated into single domain antibodies, maxibodies, minibodies, single domain antibodies, intrabodies, diabodies, triabodies, tetrabodies, v-NAR, and bis-scFv (see, e.g., Holliger, Philipp, and Peter J. Hudson, "Engineered antibody fragments and the rise of single domains." *Nature Biotechnology* 23.9 (2005): 1126). Antigen binding fragments can be grafted into scaffolds based on polypeptides such as fibronectin type III (Fn3) (see U.S. Pat. No. 6,703,199, which describes fibronectin polypeptide monobodies).

Antigen binding fragments can be incorporated into single chain molecules including a pair of tandem Fv segments (VH-CH1-VH-CH1) which, together with complementary light chain polypeptides, form a pair of antigen binding regions (Zapata, Gerardo, et al., "Engineering linear F(ab')2 fragments for efficient production in *Escherichia coli* and enhanced antiproliferative activity." *Protein Engineering, Design and Selection* 8.10 (1995): 1057-1062 and U.S. Pat. No. 5,641,870).

In some embodiments, the term "monoclonal antibody" or "monoclonal antibody composition" refers to polypeptides, including antibodies and antigen binding fragments that have substantially identical amino acid sequence or are derived from the same genetic source. This term also includes preparations of antibody molecules of single molecular composition. A monoclonal antibody composition displays a single binding specificity and affinity for a particular epitope.

In some embodiments, the term "nanoparticles" refers to atomic, molecular or macromolecular particles in the length scale, for example, of approximately 1 to 100 nm. Novel and differentiating properties and functions of nanoparticles are observed or developed at a critical length scale of matter, such as less than 100 nm. Nanoparticles can be used in constructing nanoscale structures and can be integrated into larger material components, systems, and architectures. In some embodiments, the critical length scale for novel properties and phenomena involving nanoparticles can be under 1 nm (e.g., manipulation of atoms at approximately 0.1 nm) or it can be larger than 100 nm (e.g., nanoparticle reinforced polymers have the unique feature at approximately 200 to 300 nm as a function of the local bridges or bonds between the nanoparticles and the polymer).

In some embodiments, the term "nucleation composition" refers to a substance or mixture that includes one or more nuclei capable of growing into a crystal under conditions suitable for crystal formation. A nucleation composition can, for example, be induced to undergo crystallization by evaporation, changes in reagent concentration, adding a substance such as a precipitant, seeding with a solid material, mechanical agitation, or scratching of a surface in contact with the nucleation composition.

In some embodiments, the term "particulate" refers to a cluster or agglomeration of particles such as atoms, molecules, ions, dimers, polymers, or biomolecules. Particulates can include solid matter or be substantially solid, but they can also be porous or partially hollow. They can contain a liquid or gas. In addition, particulates can be homogeneous or heterogeneous; that is, they can include one or more substances or materials.

In some embodiments, the term "polymer" refers to any substance or compound that is composed of two or more building blocks ('mers') that are repetitively linked to each other. For example, a "dimer" is a compound in which two building blocks have been joined together. Polymers include both condensation and addition polymers. Examples of condensation polymers include polyamide, polyester, protein, wool, silk, polyurethane, cellulose, and polysiloxane. Examples of addition polymers are polyethylene, polyisobutylene, polyacrylonitrile, poly(vinyl chloride), and polystyrene. Other examples include polymers having enhanced electrical or optical properties (e.g., a nonlinear optical property) such as electroconductive or photorefractive polymers. Polymers include both linear and branched polymers.

FIG. 1 illustrates an overview of components that can be included in a sensor system 100. Sensor system 100 can include a bioFET sensor array 102 coupled with a biometric fingerprint sensor 108 configured to authenticate the use of bioFET sensor array 102 (e.g., by a user). Such authentication with biometric fingerprint sensor 108 can allow (e.g., the use to have) personalized sensor systems with bioFET sensor arrays like bioFET sensor array 102 for secure bio-sensing and/or secure transmission of bio-sensing measurements to a storage system (e.g., medical record systems or Health Savings Accounts (HSAs)).

BioFET sensor array 102 can include at least one sensing element for detecting a biological or chemical analyte and a fluid delivery system 104 configured to deliver one or more fluid samples to bioFET sensor array 102. Fluid delivery system 104 can be a microfluidic well positioned above bioFET sensor array 102 to contain a fluid over bioFET sensor array 102. Fluid delivery system 104 can also include microfluidic channels for delivering various fluids to bioFET sensor array 102. Fluid delivery system 104 can include any number of valves, pumps, chambers, channels designed to deliver fluid to bioFET sensor array 102. BioFET sensor array 102 can include a repeating layout of sensors across a surface. For example, bioFET sensors can be arranged in a two-dimensional array of rows and columns across the surface.

BioFET sensor array 102 can include an array of bioFET sensors, where one or more of the bioFET sensors in the array can be functionalized to detect a particular target analyte. Different ones of the bioFET sensors can be functionalized using different capture reagents for detecting different target analytes. Further details regarding an example bioFET sensor are provided below. The bioFET sensors can be arranged in a plurality of rows and columns, forming a 2-dimensional array of bioFET sensors. In some embodiments, each row of bioFET sensors can be functionalized using a different capture reagent. In some embodiments, each column of bioFET sensors can be functionalized using a different capture reagent. In some embodiments, different sectors of the 2-dimensional array can be functionalized with different capture reagents.

A readout circuit 106 can be configured to measure signals from the bioFET sensors in bioFET sensor array 102, to generate a quantifiable sensor signal indicative of the amount of a certain analyte present in a target solution, and to output the quantifiable sensor signal to a controller 110 and/or a display device (not shown), according to some embodiments.

Biometric fingerprint sensor 108 can include an array of sensor regions and can be configured to sense a fingerprint pattern of a user based on piezoelectric or capacitive sensing. The piezoelectric or capacitive sensing of the fingerprint pattern can be based on the spatial pattern of the pressure applied by the user's fingerprint on the array of sensor regions. The pressure pattern on the array of sensor regions can correspond to the pattern of the fingerprint's ridges and valleys. Biometric fingerprint sensor 108 can be configured to convert the applied pressure into electrical signals indicative of the pattern of the fingerprint's ridges and valleys.

A controller 110 can be configured to send and receive electrical signals to both bioFET sensor array 102 and readout circuit 106 to perform bio- or chemical-sensing measurements. Controller 108 can also be configured to send electrical signals (not shown) to fluid delivery system 104 to, for example, actuate one or more valves, pumps, or motors. Controller 110 can be further configured to receive the electrical signals from biometric fingerprint sensor 108 to authenticate the fingerprint pattern of the user and to activate bioFET sensor array 102 based on the authentication. Controller 108 can use authentication data to securely transfer measurements from bioFET sensor array 102 to storage systems. Controller 108 can include one or more processing devices, such as a microprocessor, and can be programmable to control the operation of biometric fingerprint sensor 110, readout circuit 106, and/or bioFET sensor array 102. The various electrical signals that can be sent and received from bioFET sensor array 102 will be discussed in more detail below.

Embodiments described herein relate to measuring signals from one or more bioFET sensors, or arrays of bioFET sensors, in a differential manner to reduce common noise between the bioFET sensors. Accomplishing this goal can include controlling the fluid delivery to two separate bioFET sensors, or arrays of bioFET sensors, and differentially reading out the measured signals from each of the bioFET sensors, or arrays of bioFET sensors. This section describes an example embodiment of a bioFET sensor that can be used in the embodiments of the present application.

One example type of bioFET sensor that can be used in bioFET sensor array 102 (FIG. 1) is the dual gate back-side sensing FET sensor. Dual gate back-side FET sensors utilize semiconductor manufacturing techniques and biological capture reagents to form arrayed sensors. While MOSFETs can have a single gate electrode connected to a single electrical node, the dual gate back-side sensing FET sensor can have two gate structures, each of which is connected to a different electrical node. A first one of the two gate structures is referred to as a "front-side gate," and the second one of the two gate structures is referred to as a "back-side gate." Both the front-side gate and the back-side gate are configured such that, in operation, each one can be electrically charged and/or discharged and thereby each can influence the electric field between the source/drain terminals of the dual gate back-side sensing FET sensor. The front-side gate can be electrically conductive, separated from a channel region by a front-side gate dielectric, and can be configured to be charged and discharged by an electrical circuit to which it is coupled. The back-side gate can be separated from the channel region by a back-side gate dielectric and can include a bio-functionalized sensing layer disposed on the back-side gate dielectric. The amount of electric charge on the back-side gate can be a function of whether a bio-recognition reaction has occurred. In the operation of the dual gate back-side sensing FET sensors, the front-side gate can be charged to a voltage within a predetermined range of voltages. The voltage on the front-side gate can determine a corresponding conductivity of the FET sensor's channel region. A relatively small amount of change to the electric charge on the back-side gate can change the conductivity of the channel region. It is this change in conductivity that can indicate a bio-recognition reaction.

One advantage of the dual gate back-side sensing FET sensors is the prospect of label-free operation. Specifically, the dual gate back-side sensing FET sensors can enable the avoidance of costly and time-consuming labeling operations such as the labeling of an analyte with, for instance, fluorescent or radioactive probes.

Figure 2:
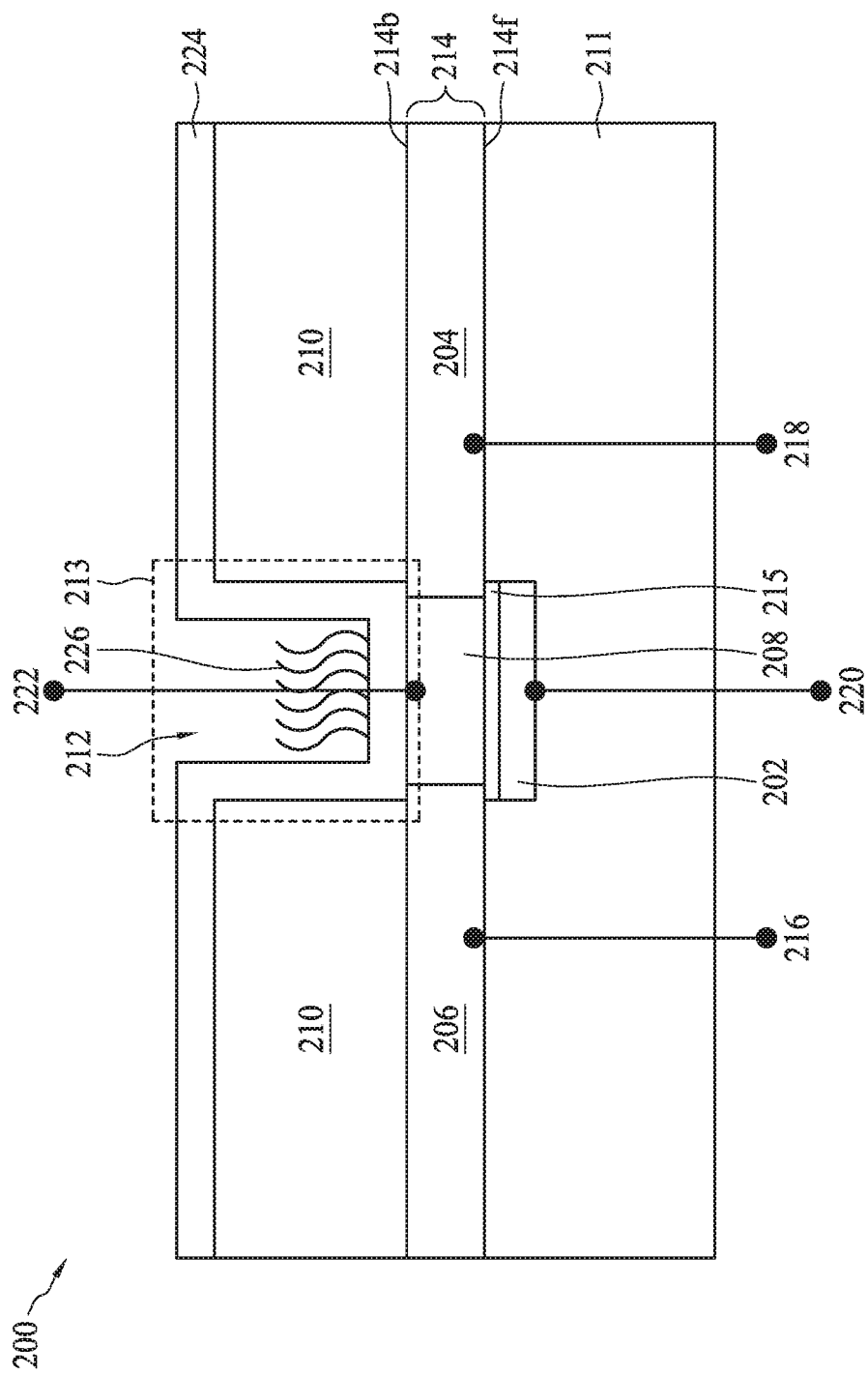
FIG. 2 illustrates a cross-sectional view of a dual-gate back-side sensing bioFET sensor, in accordance with some embodiments.

FIG. 2 illustrates a dual gate back-side sensing FET sensor 200, according to some embodiments. In some embodiments, dual gate back-side sensing FET sensor 200 can represent the bioFET sensors of bioFET sensor array 102 (FIG. 1). Dual gate back-side sensing FET sensor 200 can include a gate electrode 202 formed on a surface of a semiconductor substrate 214 and separated therefrom by an intervening gate dielectric 215 disposed on semiconductor substrate 214. A dielectric layer 211 including a plurality of interconnect layers (not shown) can be provided over one side of semiconductor substrate 214. Semiconductor substrate 214 also referred to as active layer 214 can be doped with n-type and/or p-type dopants. Semiconductor substrate 214 can include a source region 204, a drain region 206, and a channel region 208 between source region 204 and drain region 206. In some embodiments, semiconductor substrate 214 can have a thickness in a range from about 100 nm to about 130 nm. Gate electrode 202, source region 204, drain region 206, and channel region 208 can be formed using suitable CMOS process technology. Gate electrode 202, source region 204, drain region 206, and channel region 208 can form a FET. An isolation layer 210 can be disposed on the opposing side of semiconductor substrate 214 from gate electrode 202. In some embodiments, isolation layer 210 can have a thickness of about 1 μm. In this disclosure side 214f of semiconductor substrate 214 over which gate electrode 202 is disposed is referred to as the "front-side" of semiconductor substrate 214. Similarly, side 214b of semiconductor substrate 214 on which isolation layer 210 is disposed is referred to as the "back-side."

An opening 212 can be provided in isolation layer 210. Opening 212 can be substantially aligned with gate electrode 202. In some embodiments, opening 212 can be larger than gate electrode 202 and can extend over multiple dual gate back-side sensing FET sensors. An interface layer 224 can be disposed in opening 212 on the surface of channel region 208. The region of opening 212 lined with interface layer 224 along its sidewalls can form a sensing well 213. Interface layer 224 within sensing well 213 can be operable to provide an interface for positioning and immobilizing one or more capture reagents 226 that act as surface receptors for detection of biomolecules or bio-entities.

Dual gate back-side sensing FET sensor 200 can further include electrical contacts 216 and 218 to drain region 206 and source region 204, respectively. A front-side gate contact 220 can be made to gate electrode 202, while a back-side gate contact 222 can be made to channel region 208. It should be noted that back-side gate contact 222 does not need to physically contact semiconductor substrate 214 or any interface layer over semiconductor substrate 214. Thus, while a FET can use a gate contact to control conductance of the semiconductor between the source and drain (e.g., the channel), dual gate back-side sensing FET sensor 200 can allow capture reagents 226 formed on a side opposing gate electrode 202 to control the conductance, while gate electrode 202 can provide another region to control the conductance. Therefore, dual gate back-side sensing FET sensor 200 can be used to detect one or more specific biomolecules or bio-entities in the environment around and/or in opening 212, as discussed in more detail using various examples herein.

Dual gate back-side sensing FET sensor 200 can be connected to: additional passive components such as resistors, capacitors, inductors, and/or fuses; other active components, including p-channel field effect transistors (PFETs), n-channel field effect transistors (NFETs), metal-oxide-semiconductor field effect transistors (MOSFETs), high voltage transistors, and/or high frequency transistors; other suitable components; or combinations thereof. Additional features can be added in dual gate back-side sensing FET sensor 200, and some of the features described can be replaced or eliminated, for additional embodiments of dual gate back-side sensing FET sensor 200.

Figure 3:
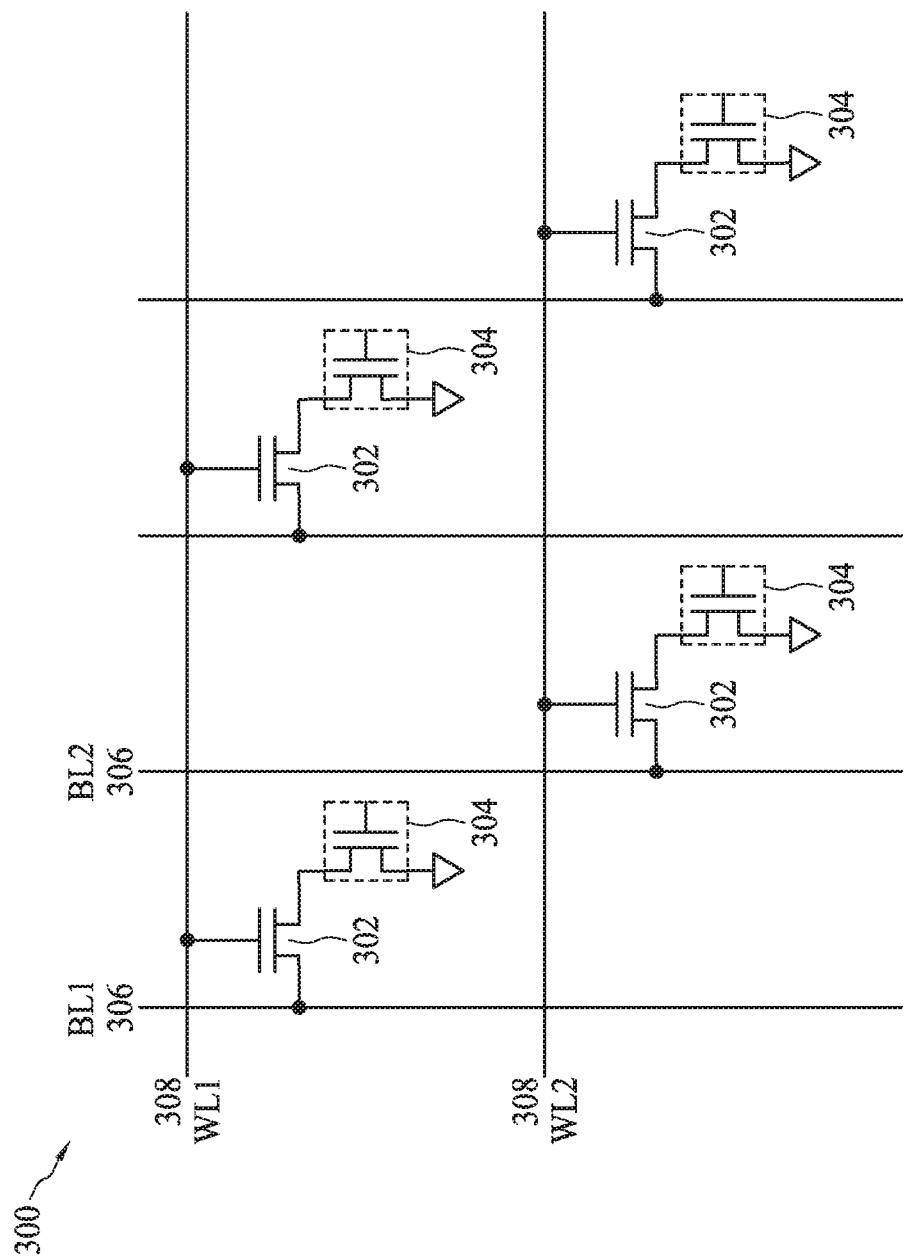
FIG. 3 illustrates a circuit diagram of a plurality of bioFET sensors configured in an addressable array, in accordance with some embodiments.

FIG. 3 illustrates a schematic of a portion of an addressable array 300 of bioFET sensors 304 connected to bit lines 306 and word lines 308, according to some embodiments. The terms bit lines and word lines are used herein to indicate similarities to array construction in memory devices, however, there is no implication that memory devices or a storage array necessarily be included in the array. Addressable array 300 can have similarities to that employed in other semiconductor devices, such as dynamic random access memory (DRAM) arrays. For example, dual gate back-side sensing FET sensor 200 (FIG. 2) can be formed in a position that a capacitor would be found in a DRAM array. Addressable array 300 is exemplary and other configurations are possible.

FETs 302 can be configured to provide an electrical connection between a drain region of bioFET sensor 304 and bit line 306. In this way, FETs 302 can be analogous to access transistors in a DRAM array. In some embodiments, each of bioFET sensors 304 can be similar to a dual gate back-side sensing FET sensor 200 and each can include a sensing gate provided by a receptor material disposed on a dielectric layer overlying a FET channel region disposed at a reaction site, and a control gate provided by a gate electrode (e.g., polysilicon) disposed on a dielectric layer overlying the FET channel region. Addressable array 300 shows an array formation designed to detect small signal changes provided by biomolecules or bio-entities introduced to bioFET sensors 304. The arrayed format using bit lines 306 and word lines 308 allows for a smaller number of input/output pads since common terminals of different FETs in the same row or column are tied together. Amplifiers can be used to enhance the signal strength to improve the detection ability of the device having the circuit arrangement of addressable array 300. In some embodiments, when voltage is applied to particular word lines 308 and bit lines 306, the corresponding access transistors 302 can be turned ON (e.g., like a switch). When the gate of the associated bioFET sensor 304 (e.g., such as back-side gate 222 of dual gate back-side sensing FET sensor 200) has its charge affected by the bio-molecule presence, a threshold voltage of bioFET sensor 304 is changed, thereby modulating the current (e.g., $I_{ds}$) for a given voltage applied to back-side gate 222. The change of the current (e.g., $I_{ds}$) or threshold voltage ($V_t$) can serve to indicate detection of the relevant biomolecules or bio-entities.

Figure 4:
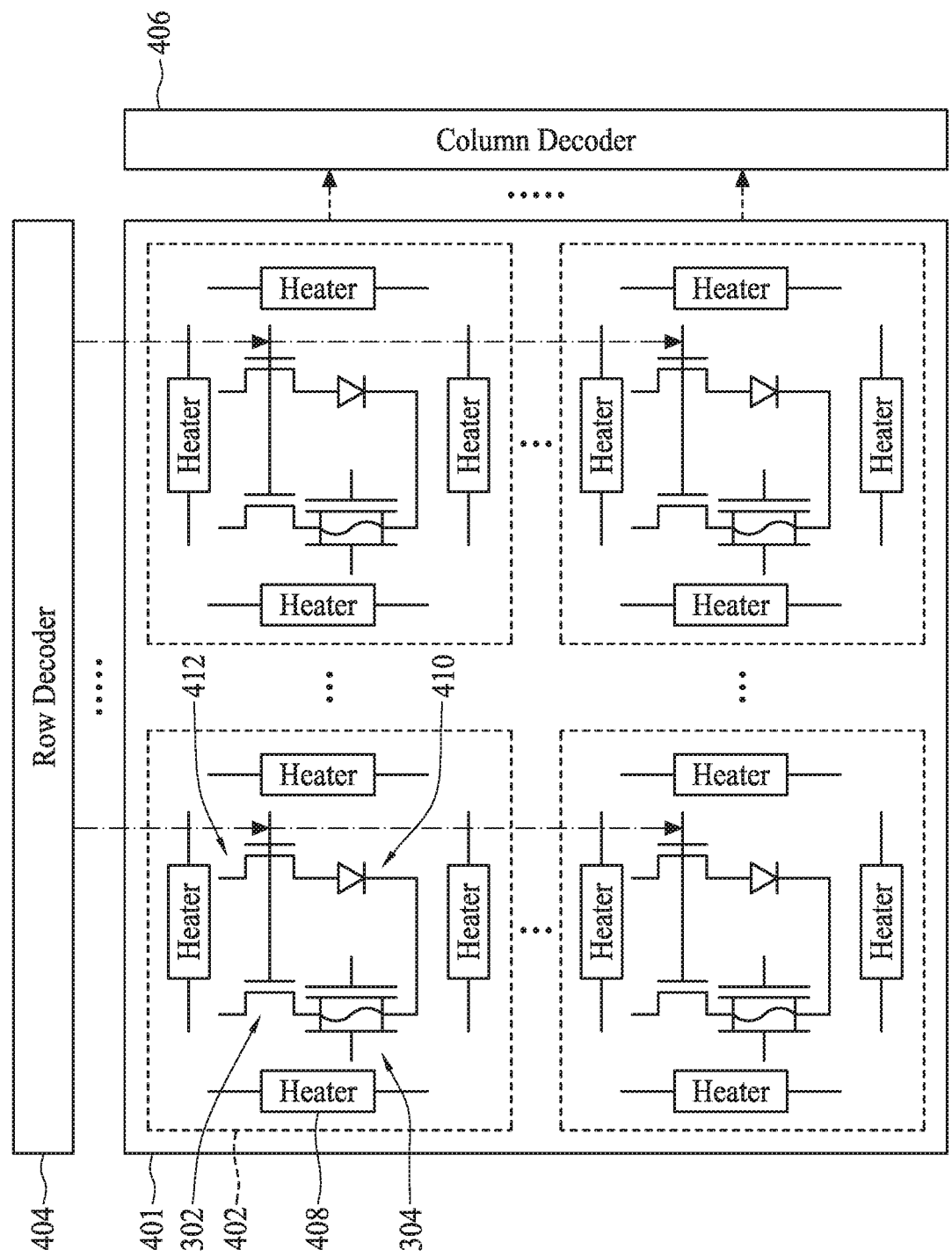
FIG. 4 illustrates a circuit diagram of an addressable array of dual gate back-side sensing FET sensors and heaters, in accordance with some embodiments.

FIG. 4 illustrates an addressable array 400 of dual gate back-side sensing FET sensors and heater. Addressable array 400 can include access transistor 302 and bioFET sensor 304 arranged as an array 401 of individually addressable pixels 402. In some embodiments, each of bioFET sensors 304 can be similar to a dual gate back-side sensing FET sensor 200. Array 401 can include any number of pixels 402. For example, array 401 can include 128×128 pixels. Other arrangements can include 256×256 pixels or non-square arrays such as 128×256 pixels.

Each pixel 402 can include access transistor 302 and bioFET sensor 304 along with other components that can include one or more heaters 408 and a temperature sensor 410. In some embodiments, access transistor 302 can be an n-channel FET. An n-channel FET 412 can also act as an access transistor for temperature sensor 410. In some embodiments, the gates of FETs 302 and 412 can be connected, though this is not required. Each pixel 402 (and its associated components) can be individually addressed using column decoder 406 and row decoder 404. In some embodiments, each pixel 402 can have a size of about 10 μm by about 10 μm, about 5 μm by about 5 μm, or about 2 μm by about 2 μm.

Column decoder 406 and row decoder 404 can be used to control the ON/OFF state of both n-channel FETs 302 and 412 (e.g., voltage is applied to the gates of FETs 302 and 412 together, and voltage is applied to the drain regions of FETs 302 and 412 together). Turning ON n-channel FET 302 can provide a voltage to a source/drain region of bioFET sensor 304. When bioFET sensor 304 is ON, a current $I_{ds}$ can flow through bioFET sensor 304 and can be measured.

Heater 408 can be used to locally increase a temperature around bioFET sensor 304. Heater 408 can be constructed using any known technique, such as forming a metal pattern with a high current running through it. Heater 408 can also be a thermoelectric heater/cooler, like a Peltier device. Heater 408 can be used during certain biological tests such as to denature DNA or RNA or to provide a binding environment for certain biomolecules. Temperature sensor 410 can be used to measure the local temperature around bioFET sensor 304. In some embodiments, a control loop can be created to control the temperature using heater 408 and the feedback received from temperature sensor 410. In some embodiments, heater 408 can be a thermoelectric heater/cooler configured to provide local active cooling to the components within pixel 402.

Figure 5A:
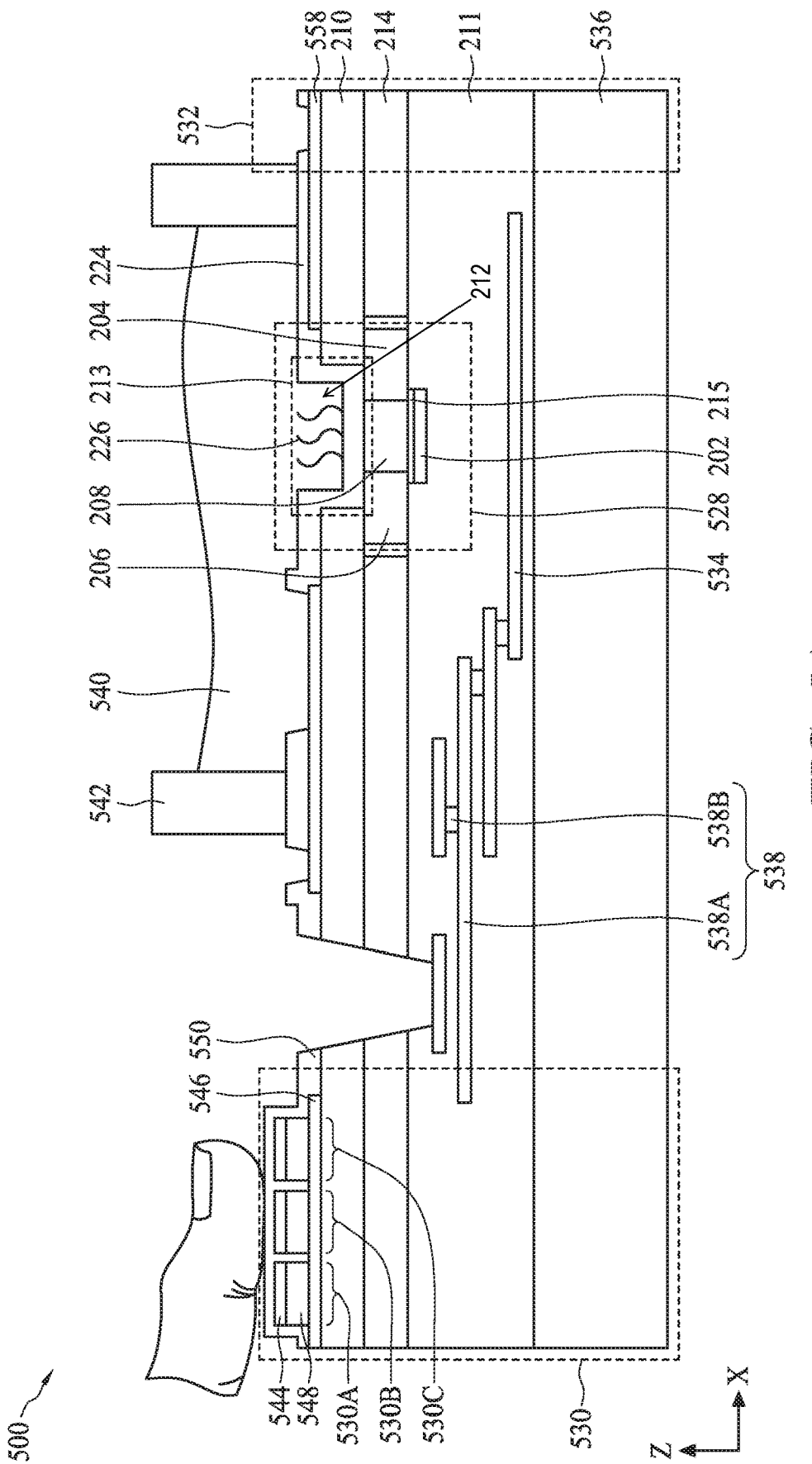
FIGS. 5A-5B illustrate cross-sectional views of a semiconductor device with a bioFET sensor, a biometric fingerprint sensor, and a temperature sensor, in accordance with some embodiments.

FIG. 5A illustrates a cross-sectional view of a semiconductor device 500, according to some embodiments. The cross-sectional view of semiconductor device 500 is shown for illustration purposes and may not be drawn to scale. Semiconductor device 500 can include a bioFET sensor 528, a biometric fingerprint sensor 530, a temperature sensor 532, and a heater 534 disposed on a carrier substrate 536. The discussion of dual gate back-side sensing FET sensor 200 applies to bioFET sensor 528 unless mentioned otherwise. The elements of FIG. 5A with the same annotations as elements in FIG. 2 are described above. Though one bioFET sensor 530 is shown in FIG. 5A, semiconductor device 500 can include an array of bioFET sensors 530. In some embodiments, biometric fingerprint sensor 530, temperature sensor 532, and heater 534 can be an implementation of biometric fingerprint sensor 108 (FIG. 1), temperature sensor 410 (FIG. 4), and heater 408 (FIG. 4), respectively. The discussion of biometric fingerprint sensor 108, temperature sensor 410, and heater 408 applies to biometric fingerprint sensor 530, temperature sensor 532, and heater 534, respectively, unless mentioned otherwise.

BioFET sensor 528 can include gate electrode 202, source region 204, drain region 206, and channel region 208, where source region 204 and drain region 206 are formed within semiconductor substrate 214. In some embodiments, semiconductor substrate 214 can be formed from a single semiconductor crystal, such as crystalline silicon. Alternatively, semiconductor substrate 214 can include (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, semiconductor substrate 214 can be doped with p-type dopants (e.g., boron, indium, aluminum, or gallium) or n-type dopants (e.g., phosphorus or arsenic). In some embodiments, semiconductor substrate 214 can have a vertical dimension along a Z-axis in a range from about 5 nm to about 200 nm.

Gate electrode 202, source region 204, drain region 206, and channel region 208 form a FET. BioFET sensor 528 can be coupled to additional circuitry (not shown) fabricated within semiconductor substrate 214. The additional circuitry can include any number of MOSFET devices, resistors, capacitors, and/or inductors to form circuitry to aid in the operation of bioFET sensor 528. The additional circuitry can represent readout circuit 106 of FIG. 1 used to measure a signal from bioFET sensor 528 that is indicative of analyte detection. The additional circuitry can include amplifiers, analog to digital converters (ADCs), digital to analog converters (DACs), voltage generators, logic circuitry, and/or DRAM memory, to name a few examples.

BioFET sensor 528 can further include interface layer 224 disposed on isolation layer 210 and within opening 212 over channel region 208. In some embodiments, isolation layer 210 can include a dielectric material, such as silicon oxide. In some embodiments, isolation layer 210 can have a vertical dimension along a Z-axis in a range from about 1 nm to about 500 nm. In some embodiments, interface layer 224 can have a thickness on channel region 208 in a range from about 20 Å to about 40 Å. Interface layer 224 can include a high-k dielectric material, such as hafnium silicate, hafnium oxide ($HfO_2$), zirconium oxide ($ZrO_2$), aluminum oxide ($Al_2O_3$), tantalum pentoxide ($Ta_2O_5$), hafnium dioxide-alumina ($HfO_2$—$Al_2O_3$) alloy, or any combinations thereof. Interface layer 224 can act as a support for the attachment of capture reagents 226. A solution 540 can be provided over the reaction site of bioFET sensor 528. Solution 540 can be a buffer solution with capture reagents, target analytes, wash solution, or any other biological or chemical species. In some embodiments, solution 540 can be provided within a microfluidic channel 542 of semiconductor device 500 disposed on the portion of interface layer 224 extending over isolation layer 210.

In some embodiments, bioFET sensor 528 can be coupled to a multi-layer interconnect (MLI) structure 538 disposed within dielectric layer 211 of semiconductor device 500. Dielectric layer 211 can be disposed on carrier substrate 536 and can be an inter-layer dielectric or ILD layer and/or composed of multiple ILD sub-layers. In some embodiments, dielectric layer 211 can include an oxide or a nitride material. In some embodiments, dielectric layer 211 can have a vertical dimension along a Z-axis in a range from about 50 nm to about 5000 nm. MLI structure 538 can include a plurality of conductive lines 538A electrically connected to each other through conductive vias or plugs 538B. In some embodiments, conductive lines 538A can include aluminum and/or copper, and conductive vias or plugs 538B can include tungsten or copper. MLI structure 538 can be configured to provide electrical connection to bioFET sensor 528 with various doped regions and/or devices formed within semiconductor substrate 214.

Biometric fingerprint sensor 530 can include an array of sensor regions 530A-530C with a common bottom electrode 546 disposed on isolation layer 210, which is disposed on semiconductor substrate 214. Each of sensor regions 530A-530C can further include a top electrode 544 and a sensing material 548. In some embodiments, each sensing material 548 can be disposed on bottom electrode 546 at a pitch distance of about 1 μm to about 500 μm. In some embodiments, sensing material 548 can be a piezoelectric material, such as lead zirconate titanate (also referred to as PZT), aluminum nitride (AlN), or zinc oxide (ZnO) for piezoelectric biometric fingerprint sensor 530 or a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), or any combination thereof for capacitive biometric fingerprint sensor 530. In some embodiments, sensing material 548 can have a vertical dimension along a Z-axis in a range from about 100 nm to about 2000 nm. Top and bottom electrodes 544 and 546 can include conductive materials, such as platinum (Pt), gold (Au), zinc (Zn), copper (Cu), aluminum (Al), lead (Pb), tungsten (W), tin (Sn), iron (Fe), nickel (Ni), lithium (Li), or a metal with a high temperature coefficient of resistance (e.g., greater than about $1 \times 10^{-3}$/° C.). In some embodiments, each of top and bottom electrode 544 and 546 can have a vertical dimension along a Z-axis in a range from about 20 nm to about 500 nm. The vertical dimension of top electrode 544 within this range can provide a flexible top electrode for sensing the pressure applied by a user's fingerprint on sensing material 548 of the array of sensor regions 530A-530C. The vertical dimension of top electrode 544 outside the range of about 20 nm to about 500 nm can reduce the flexibility of top electrode 544 and thus reduce the sensitivity of biometric fingerprint sensor 530.

Biometric fingerprint sensor 530 can further include a sensing layer 550 disposed on the array of sensor regions 530A-530C. Sensing layer 550 can also be disposed between adjacent sensor regions of the array of sensor regions 530A-530C to electrically isolate them from each other. Sensing layer 550 can include high-k materials, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), silicon oxide ($SiO_2$), silicon nitride, yttrium oxide ($Y_2O_3$), lanthanum oxide ($La_2O_3$), or any combination thereof. In some embodiments, sensing layer 550 can have a vertical dimension along a Z-axis in a range from about 1 nm to about 100 nm. The vertical dimension of sensing layer 550 within this range can provide a flexible insulating layer that is sensitive to the pressure applied by the user's fingerprint on top electrodes 544.

Figure 5B:
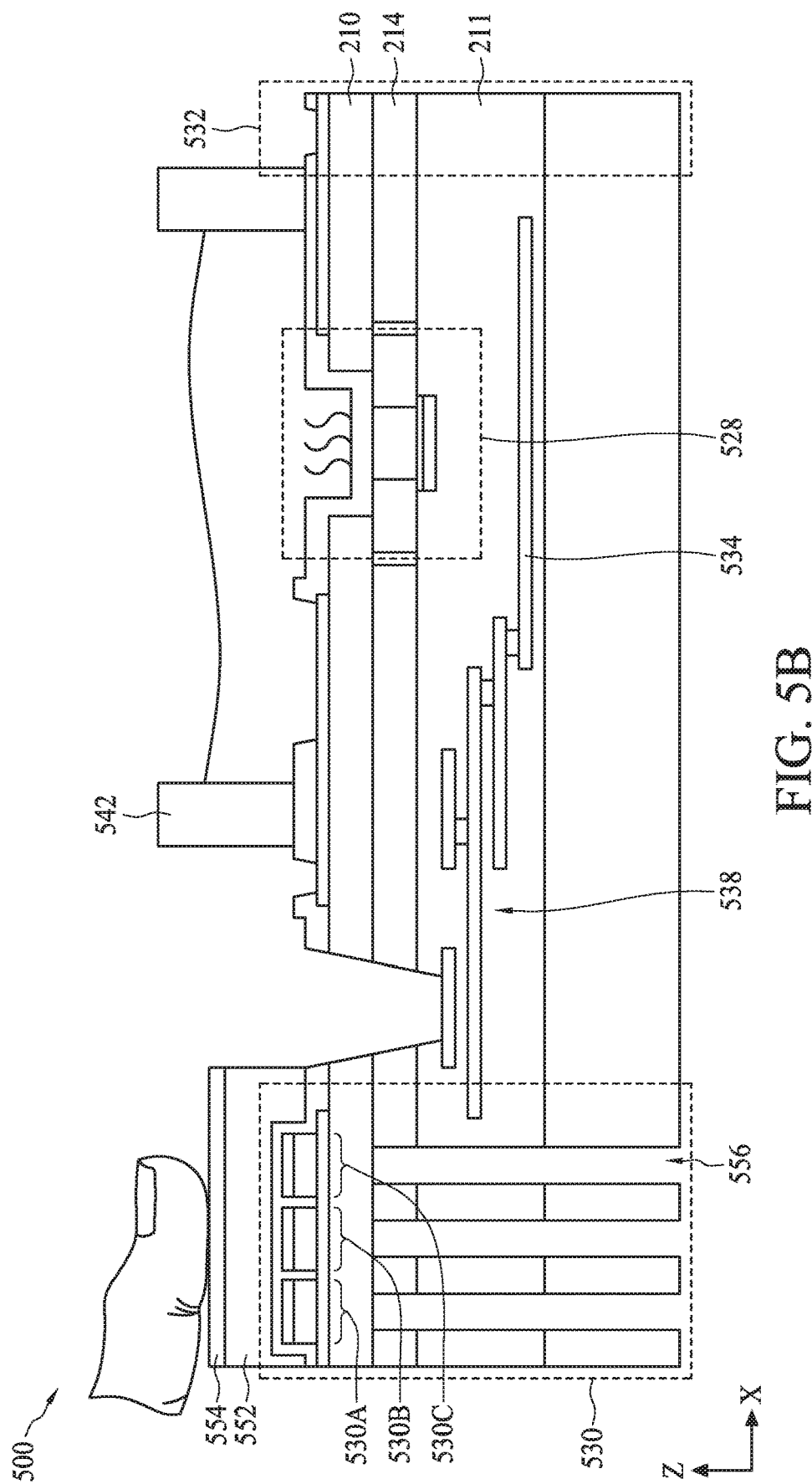

In some embodiments, as shown in FIG. 5B, biometric fingerprint sensor 530 can optionally include a coupling layer 552 disposed on sensing layer 550, a cover plate 554 disposed on coupling layer 552, and an array of cavities 556 on back side of biometric fingerprint sensor 530. Coupling layer 552 can include a polymeric material and can have a vertical dimension along a Z-axis in a range from about 1 μm to about 1000 μm. Coupling layer 552 can be configured to provide additional flexibility to the underlying sensing layer 550 and/or top electrodes 544 for increased sensitivity to the pressure applied by the user's fingerprint on sensing material 548 of the array of sensor regions 530A-530C. Cover plate 554 can include sapphire glass or other suitable protective material for protecting coupling layer 552 when pressure applied by the user's fingerprint on biometric fingerprint sensor 530. In some embodiments, cover plate 554 can have a vertical dimension along a Z-axis in a range from about 1000 μm to about 40000 μm. In some embodiments, each cavity 556 can have a vertical dimension along a Z-axis in a range from about 300 μm to about 1000 μm and a horizontal dimension along an X-axis in a range from about 1 μm to about 500 μm. The array of cavities 556 can be configured to create a resonating cavity for increasing amplitude of ultrasound generated by biometric fingerprint sensor 530.

Figure 6:
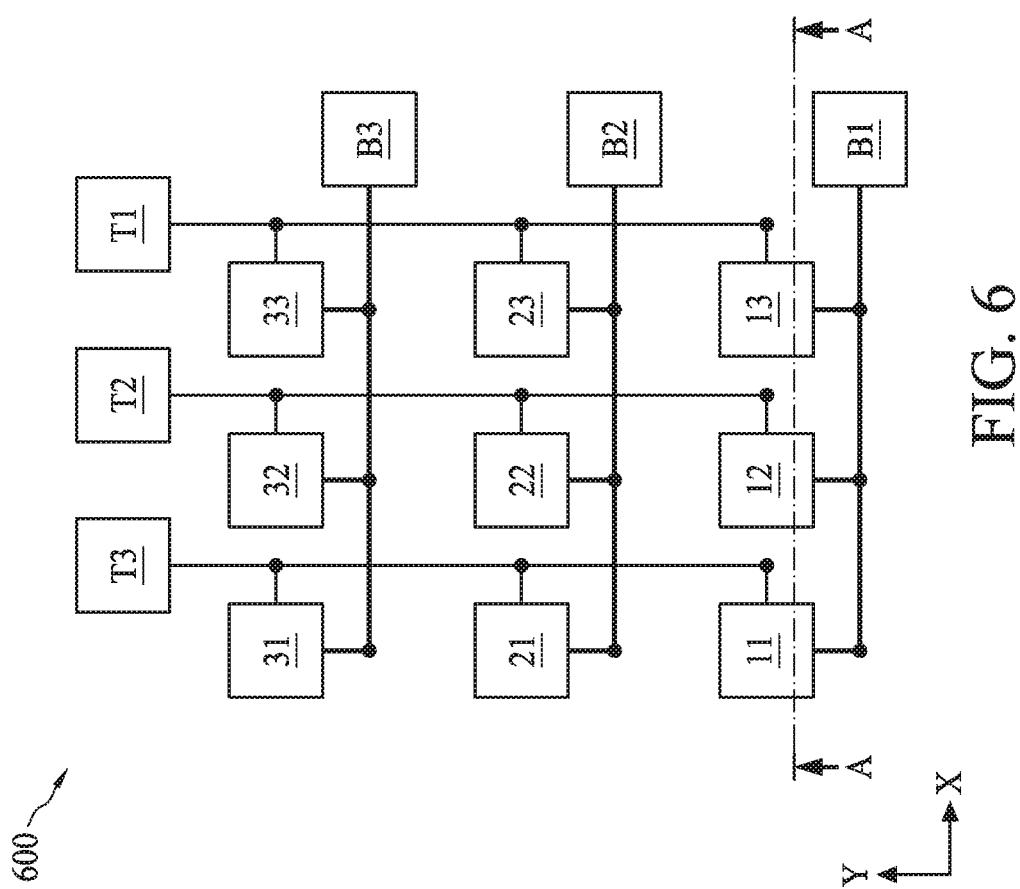
FIG. 6 illustrates a circuit diagram of a biometric fingerprint sensor, in accordance with some embodiments.

Though three sensor regions 530A-530C is shown in FIGS. 5A-5B, biometric fingerprint sensor 530 can include a 2-dimensional array of sensor regions similar to sensor region 530A-530C as shown in FIG. 6. FIG. 6 illustrates a plan view of a 2-dimensional array 600 having nine sensor regions 11-33, where each row (along an X-axis) of sensor regions can be similar to the array of sensor regions 530A-530C and the cross-sectional view of the array of sensor regions 530A-530C can be along line A-A of FIG. 6. The discussion of the array of sensor regions 530A-530C applies to each row of sensor regions of array 600 unless mentioned otherwise. In FIG. 6, only sensing material 548 are shown to represent sensor regions 11-33 and top and bottom electrodes 544 and 546 are not shown for clarity.

In array 600, top electrodes 544 of each column (along a Y-axis) of array 600 can be connected to a voltage source represented by T1, T2, and T3, and bottom electrode 546 of each row (along an X-axis) of array 600 can be connected to a voltage source represented by B1, B2, and B3. Bottom electrode 546 can be common for sensor regions along each row, and not along each column of array 600. During operation of biometric fingerprint sensor 530, each sensor regions of array 600 can be sequentially or in any order activated by supplying voltage from its corresponding voltage sources. For example, sensor region 11 can be activated by supplying voltage from voltage sources T1 and B1, and sensor region 12 can be activated by supplying voltage from voltage sources T2 and B1. In some embodiments, the voltage supplied by voltage sources T1-T3 can be greater than that supplied by voltage sources B1-B3. In some embodiments, the voltage supplied by voltage sources T1-T3 can be in a range from about 0.5 V to about 5 V. In some embodiments, voltage sources B 1-B3 can be at ground potential and bottom electrodes 546 can be grounded during operation of biometric fingerprint sensor 530. In some embodiments, voltages supplied to bioFET sensor 528, biometric fingerprint sensor 530, and temperature sensor 532 during their operation different from each other. In some embodiments, the voltage supplied to bioFET sensor 528 during its operation can range from about 0.5 V to about 2.5 V and the voltage supplied to temperature sensor 532 during its operation can range from about 0.5 V to about 2 V.

Referring back to FIG. 5A, temperature sensor 532 can include a sensing electrode 558 disposed on isolation layer 210, which is disposed on semiconductor substrate 214. Temperature sensor 532 can be configured to measure the temperature of devices (e.g., bioFET sensor 528) within semiconductor substrate 214 and/or solutions (e.g., solution 540) within opening 212 based on the variations in resistance of sensing electrode 558 with variations in temperature. Sensing electrode 558 can include a material with a stable resistance-temperature relationship, which can be the amount of resistance change of the material per degree of temperature change. In some embodiments, this material can include Pt, Au, Zn, Cu, Al, Pb, W, Sn, Fe, Ni, Li, or a metal with a high temperature coefficient of resistance (e.g., greater than about $1 \times 10^{-3}/°$ C.).

Heater 534 can include resistive elements coupled to a suitable current supply. In some embodiments, heater 534 can be supplied with current through MLI structure 538. In some embodiments, heater 534 can include doped polysilicon and/or can have the same dopant concentration profile as semiconductor substrate 214.

Figure 7:
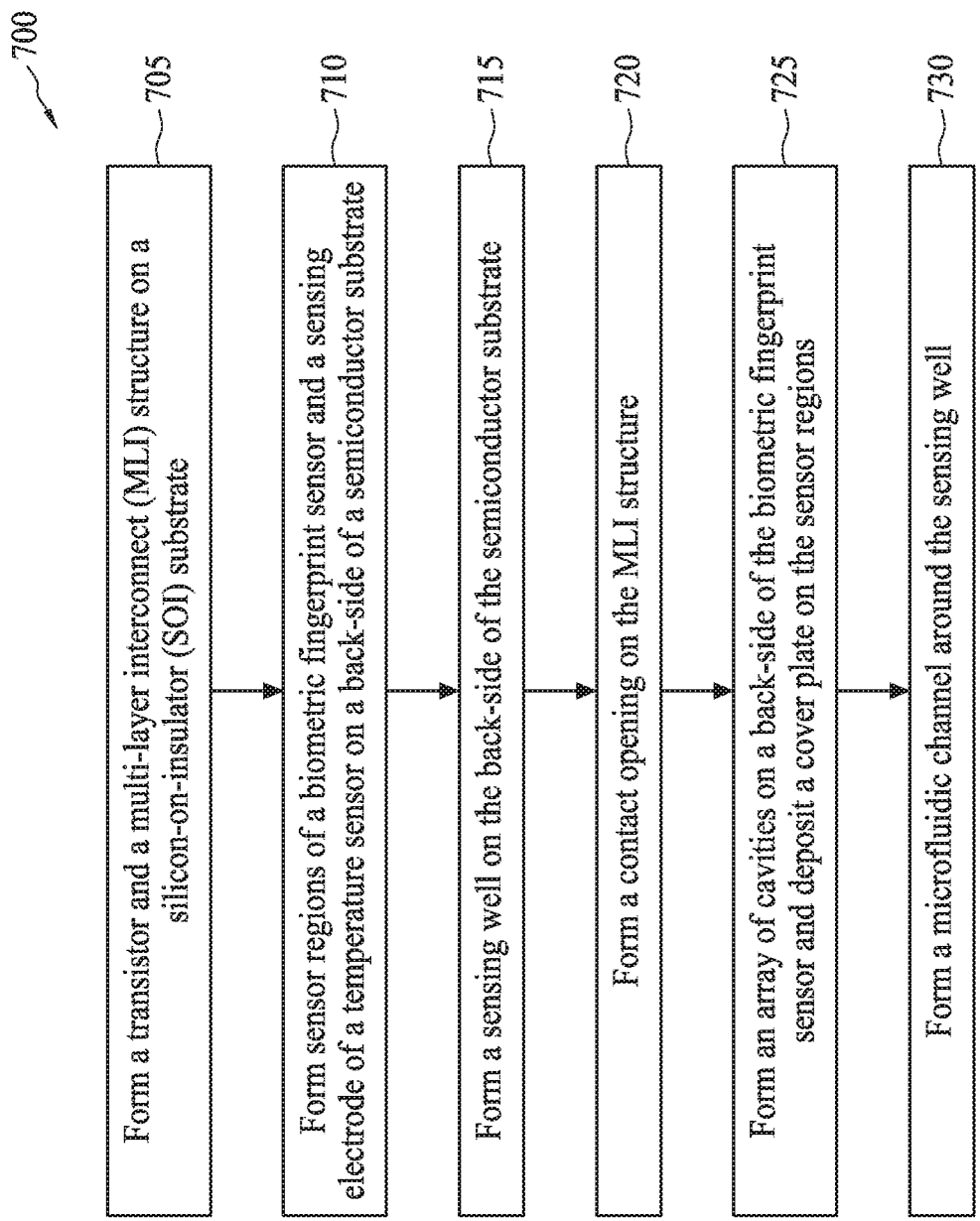
FIG. 7 is a flow diagram of a method for fabricating a semiconductor device with a bioFET sensor, a biometric fingerprint sensor, and a temperature sensor, in accordance with some embodiments.

FIG. 7 is a flow diagram of a method 700 for fabricating semiconductor device 500 as described with reference to FIGS. 5A-5B, according to some embodiments. For illustrative purposes, the operations illustrated in method 700 will be described with reference to the example fabrication process for fabricating semiconductor device 500 as illustrated in FIGS. 8-18. FIGS. 8-18 are cross-sectional views of semiconductor device 500 at various stages of its fabrication process. Operations can be performed in a different order or not performed depending on specific applications. It should be noted that method 700 may not produce a complete semiconductor device 500. Accordingly, it is understood that additional processes can be provided before, during, and after method 700, and that some other processes may only be briefly described herein. Elements in FIGS. 8-18 with the same annotations as elements in FIGS. 5A-5B are described above.

In operation 705, a transistor and a multi-layer interconnect (MLI) structure are formed on a substrate. For example, as described with reference to FIG. 8, a field effect transistor (FET) 801 and MLI structure 538 can be formed on a substrate 860. The process for forming FET 801 on substrate 860 can include forming substrate 860, forming gate electrode 202, and forming source and drain regions 204 and 206.

The process for forming substrate 860 can include forming a silicon-on-insulator (SOI) substrate that can include semiconductor substrate 214 (also referred to as active layer 214), a buried oxide layer 210*, which can form isolation layer 210 in subsequent processing, and a bulk semiconductor 810. In some embodiments, the SOI substrate can be formed through separation by implanted oxygen (SIMOX). The process for forming gate electrode 202 can include depositing a dielectric material for gate dielectric 215 on semiconductor substrate 214 and a conductive material for gate electrode 202 on gate dielectric 215, followed by patterning and etching of the deposited materials.

The dielectric material for gate dielectric 215 can include (i) silicon oxide, silicon nitride, and/or silicon oxynitride, (ii) a high-k dielectric material, such as $HfO_2$, $TiO_2$, $HfZrO$, $Ta_2O_3$, $HfSiO_4$, $ZrO_2$, and $ZrSiO_2$, (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof and can be formed by CVD, atomic layer deposition (ALD), physical vapor deposition (PVD), e-beam evaporation, or other suitable processes.

In some embodiments, the conductive material for gate electrode 202 can include Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof and can be formed by ALD, PVD, CVD, or other suitable deposition processes.

Figure 8:
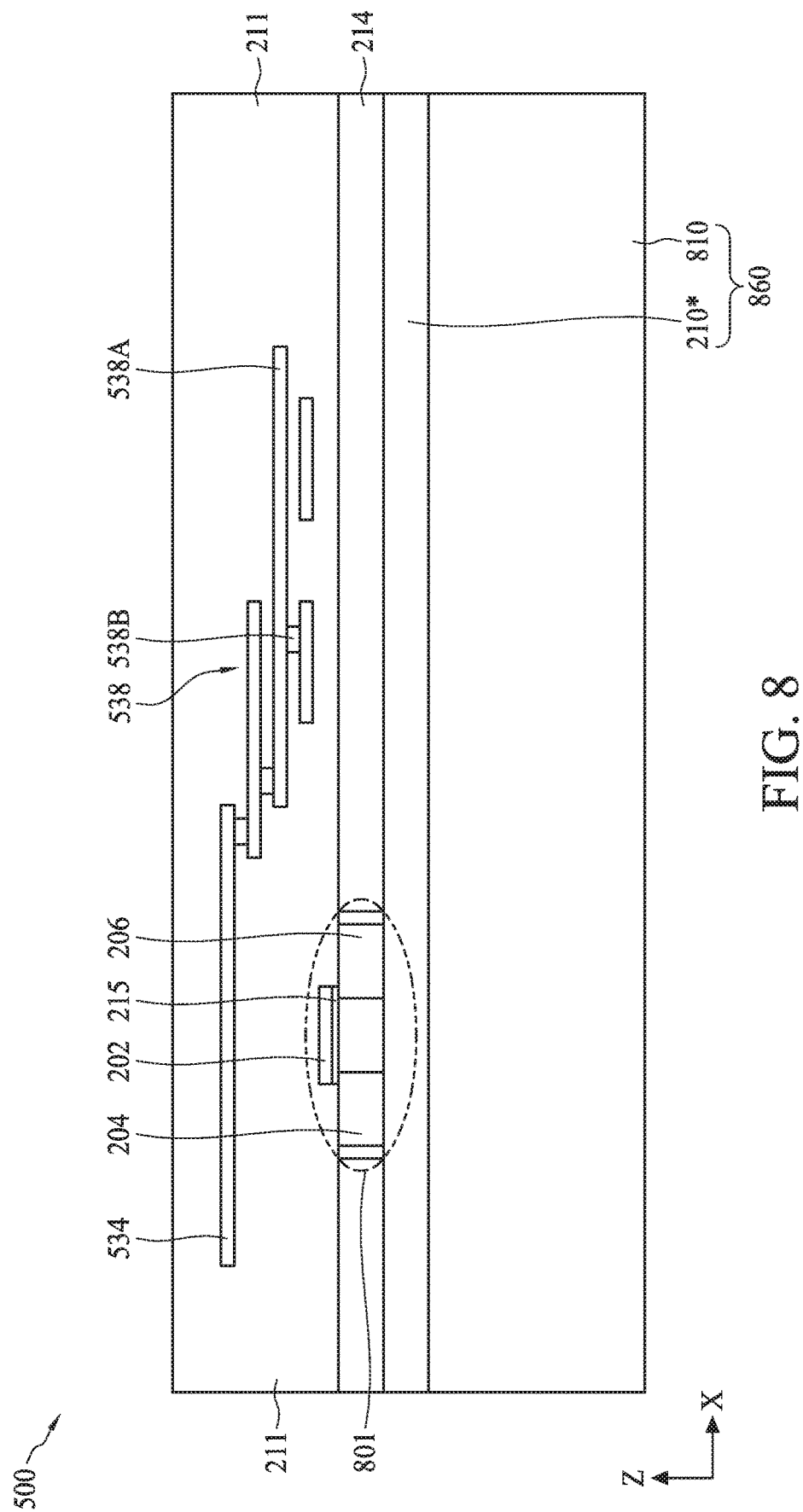
FIGS. 8-18 illustrate cross-sectional views of a semiconductor device with a bioFET sensor, a biometric fingerprint sensor, and a temperature sensor at various stages of its fabrication process, in accordance with some embodiments.

The process for forming gate electrode 202 can be followed by the process for forming source and drain regions 204 and 206, which can include doping regions of semiconductor substrate 214 with n-type or p-type dopants. After the process for forming source and drain regions 204 and 206, MLI structure 538 can be formed on substrate 860. The process for forming MLI structure 538 can include sequentially forming multiple layers, each of which can include conductive lines 538A and conductive vias 538B in a stack of dielectric layers that subsequently form interlayer dielectric (ILD) layer 211 as shown in FIG. 8. The multiple layers can be deposited by CVD, PVD, ALD, plating, or spin-on coating. Conductive lines 538A can include Cu, Al, W, Ta, Ti, Ni, Co, metal silicide, metal nitride, polysilicon, or any combinations thereof. The dielectric layers of ILD 211 can include silicon oxide, fluorinated silicon glass (FGS), silicon oxycarbide (SiOC), and/or other insulating materials. MLI may be formed by suitable processes typical in CMOS fabrication, such as CVD, PVD, ALD, plating, spin-on coating, and/or other processes. In some embodiments, heater 534 can be formed by the process for forming MLI structure 538.

Referring to FIG. 7, in operation 710, sensor regions of a biometric fingerprint sensor and a sensing electrode of a temperature sensor are formed on a back-side of a semiconductor substrate. For example, as described with reference to FIGS. 9-12, sensor regions 530A-530C of biometric fingerprint sensor 530 and sensing electrode 558 of temperature sensor 532 can be formed on back-side 214*b* of semiconductor substrate 214.

The process for forming sensor regions 530A-530C can include (i) bonding carrier substrate 536 to front-side 214*f* of semiconductor substrate 214, (ii) removing bulk semiconductor 810, (iii) depositing materials for bottom electrode 546, sensing material 548, and top electrodes 544, and (iv) patterning and etching the deposited materials.

Figure 9:
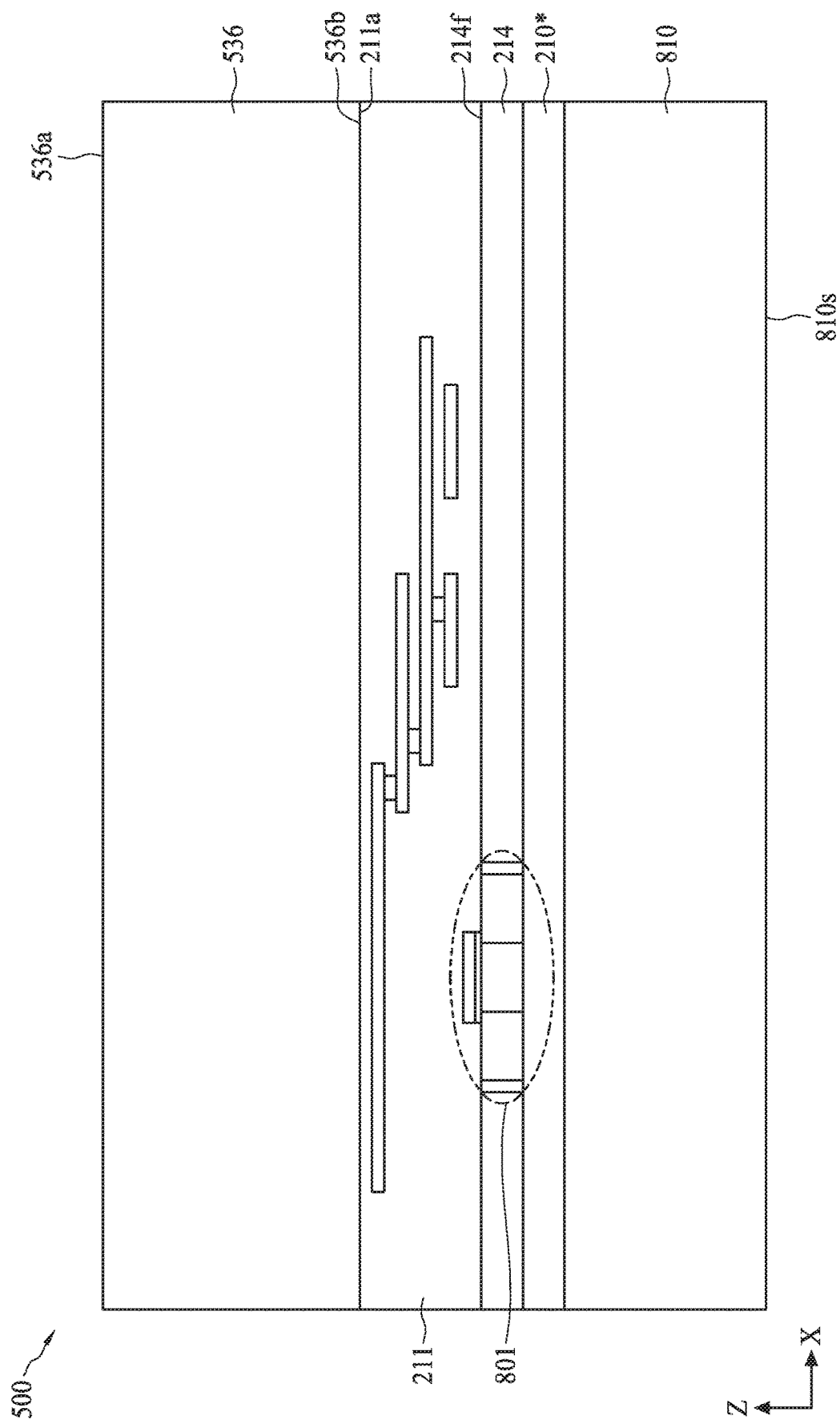

Referring to FIG. 9, the bonding of carrier substrate 536 to front-side 214*f* can include using a wafer bonding process, such as fusion bonding, anodic bonding, eutectic bonding, or a suitable wafer bonding process, to bond back surface 563*b* of carrier substrate 536 to ILD top surface 211*a* of ILD layer 211. In the case of fusion bonding, the wafer bonding process can include bringing carrier substrate 536 and ILD top surface 211*a* into physical contact, followed by an annealing process that forms a bond (e.g., Si/Si bond, oxide/oxide bond, or oxide/Si bond) between carrier substrate 536 and ILD top surface 211*a*. The annealing process can be performed at a temperature ranging from about 200° C. to about 480° C. The fusion bonding process can further include applying a force on top surface 536*a* of carrier substrate 536 for a period of time before or during the annealing process. The force can range from about 0.1 N to about 5 N, and the period of time can range from about 10 seconds to about 10 minutes. In some embodiments, carrier substrate 536 can be bonded to ILD top surface 211*a* with a polysilicon layer as a bonding interface between back surface 563*b* and ILD top surface 211*a*. In some embodiments, carrier substrate 536 can include silicon, glass, and/or quartz.

Figure 10:
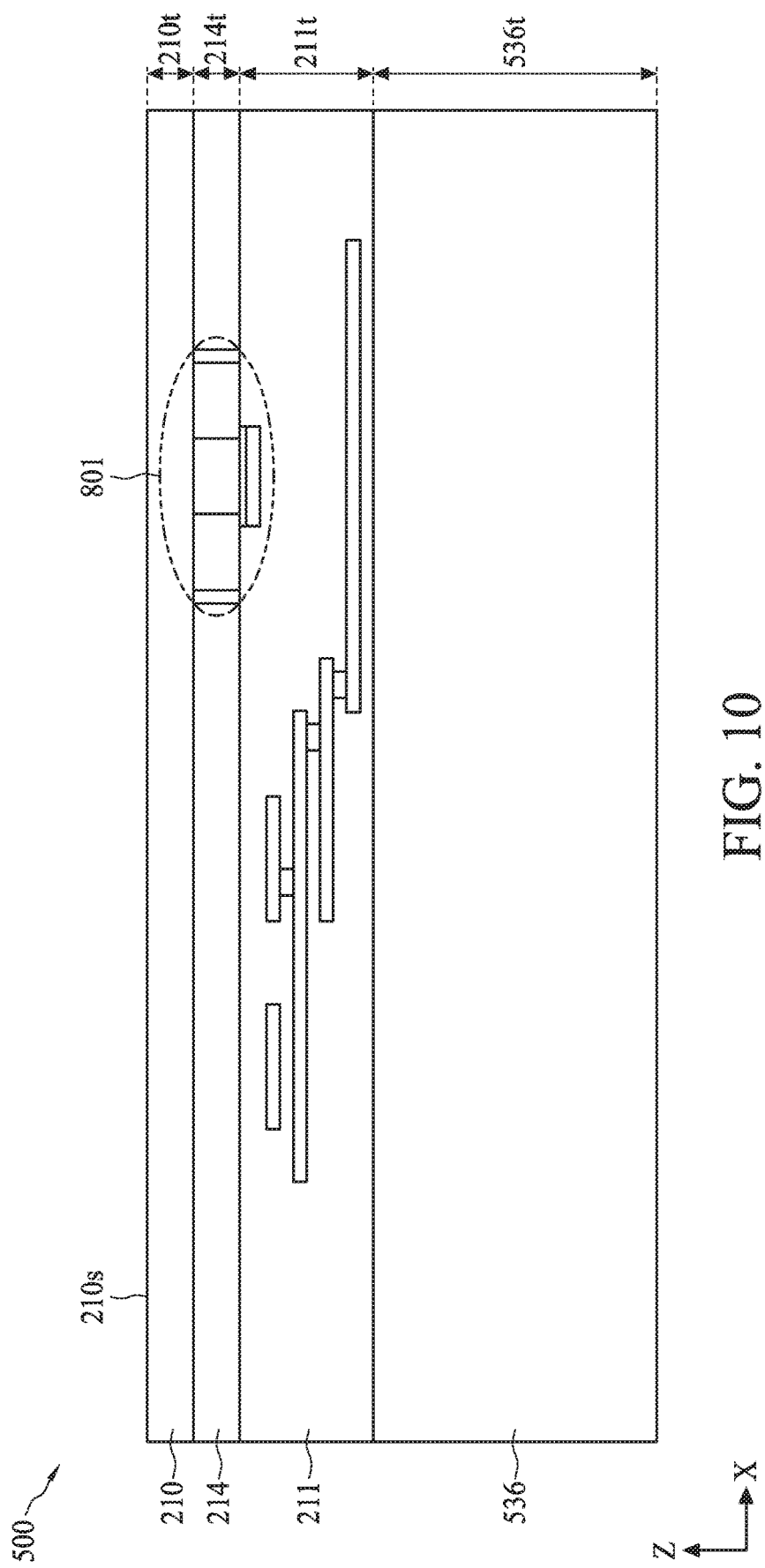

Referring to FIGS. 9 and 10, the wafer bonding process can be followed by a wafer thinning process to remove bulk semiconductor 810 and expose buried oxide layer 210*, which forms isolation layer 210 on semiconductor substrate 214. Prior to the wafer thinning process, the structure of FIG. 9 can be flipped vertically along an X-axis. The wafer thinning process can include a grinding process, a polishing process, and/or an etching process performed on exposed surface 810*s* of bulk semiconductor 810 of FIG. 9's structure.

The grinding process can include grinding on surface 810*s* of bulk semiconductor 810 with a grinding tool for a period of time ranging from about 30 seconds to about 10 minutes until surface 210*s* of isolation layer 210 is exposed as shown in FIG. 10. The polishing process can include performing a CMP process on surface 810*s* of bulk semiconductor 810 until surface 210*s* of isolation layer 210 is exposed as shown in FIG. 10. The etching process can include a dry etch (e.g., a plasma etch) or a wet etch process. The wet etch process can include etching surface 810*s* of bulk semiconductor 810 with an etchant having hydrofluoric acid (HF), nitric acid ($HNO_3$), or a combinations thereof until surface 210*s* of isolation layer 210 is exposed as shown in FIG. 10. In some embodiments, the etchant can include $HNO_3$ with a concentration in a range from about 50% to about 90%. In some embodiments, the etchant can include $HNO_3$ with a concentration in a range from about 10% to about 50% mixed with hydrofluoric acid (HF) with a concentration in a range from about 10% to about 50%. In some embodiments, bulk semiconductor 810 can be removed by using the grinding process, followed by the polishing process, and then the etching process.

In the structure of FIG. 10, isolation layer 210 can have a vertical dimension 210*t* along a Z-axis in a range from about 1 nm to about 500 nm, semiconductor substrate 214 can have a vertical dimension 214*t* in a range from about 5 nm to about 200 nm, ILD layer 211 can have a vertical dimension 211*t* in a range from about 50 nm to about 5000 nm, and carrier substrate can have a vertical dimension 536*t* in a range from about 400 μm to about 1000 μm.

Figure 11:
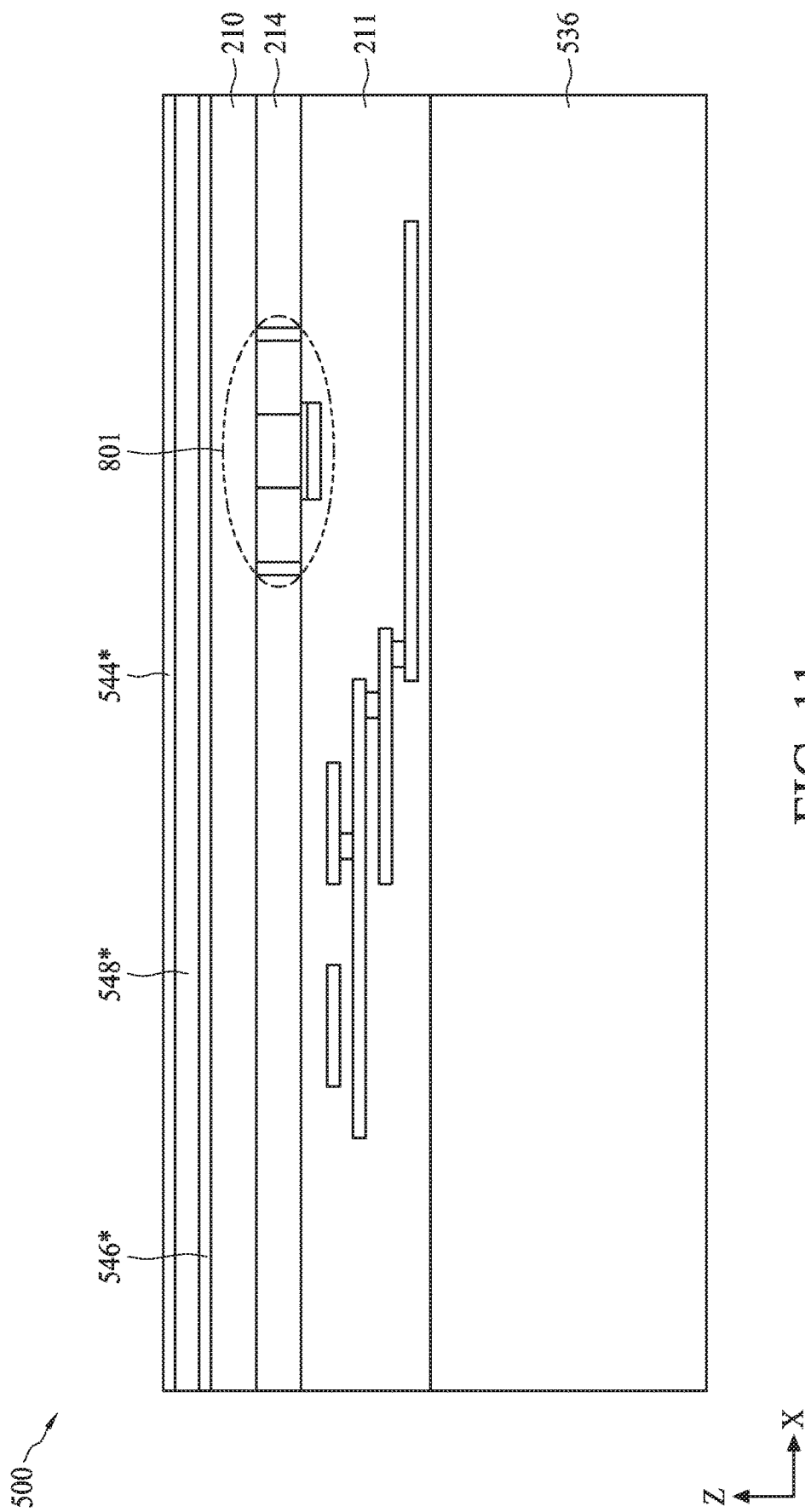

Referring to FIG. 11, the process for removing bulk semiconductor 810 can be followed by a process for depositing a conductive material layer 546* on isolation layer 210 for simultaneous formation of bottom electrode 546 and sensing electrode 558 in subsequent processing (shown in FIG. 12), according to some embodiments. The deposition of conductive material layer 546* can be followed by a process for depositing a piezoelectric material layer 548* or dielectric material layer 548* on conductive material layer 546* for subsequent formation of sensing material 548 (shown in FIG. 12). The deposition of layer 548* can be followed by a process for depositing a conductive material layer 544* on layer 548* for subsequent formation of top electrodes 544 (shown in FIG. 12).

The process for depositing conductive material layers 544* and 546* can include depositing conductive materials, such as Pt, Au, Zn, Cu, Al, Pb, W, Sn, Fe, Ni, Li, or a metal with a high temperature coefficient of resistance using deposition methods, such as e-gun evaporation or sputtering. In some embodiments, the process for depositing conductive material layers 544* and 546* can include depositing conductive materials, such as, silver (Ag) or silver chloride (AgCl) using e-gun evaporation, sputtering, electroplating, or screen printing. In some embodiments, the process for depositing conductive material layers 544* and 546* can further include depositing layers 544* and 546* each with a vertical dimension along a Z-axis in a range from about 20 nm to about 500 nm.

The process for depositing piezoelectric material layer 548* can include depositing a piezoelectric material, such as PZT, AlN, or ZnO, for piezoelectric biometric fingerprint sensor 530. The process for depositing dielectric material layer 548* can include depositing a high-k dielectric material, such as $HfO_2$, $TiO_2$, $HfZrO$, $Ta_2O_3$, $HfSiO_4$, $ZrO_2$, $ZrSiO_2$, or any combinations thereof, for capacitive biometric fingerprint sensor 530. Piezoelectric material layer 548* can be deposited using deposition methods, such as sol-gel, physical vapor deposition (PVD), or chemical vapor deposition (CVD) at temperature ranging from about 80° C. to about 100° C. Dielectric material layer 548* can be deposited using PVD or CVD. In some embodiments, the process for depositing layer 548* can further include depositing layer 548* with a vertical dimension along a Z-axis in a range from about 100 nm to about 2000 nm.

Figure 12:
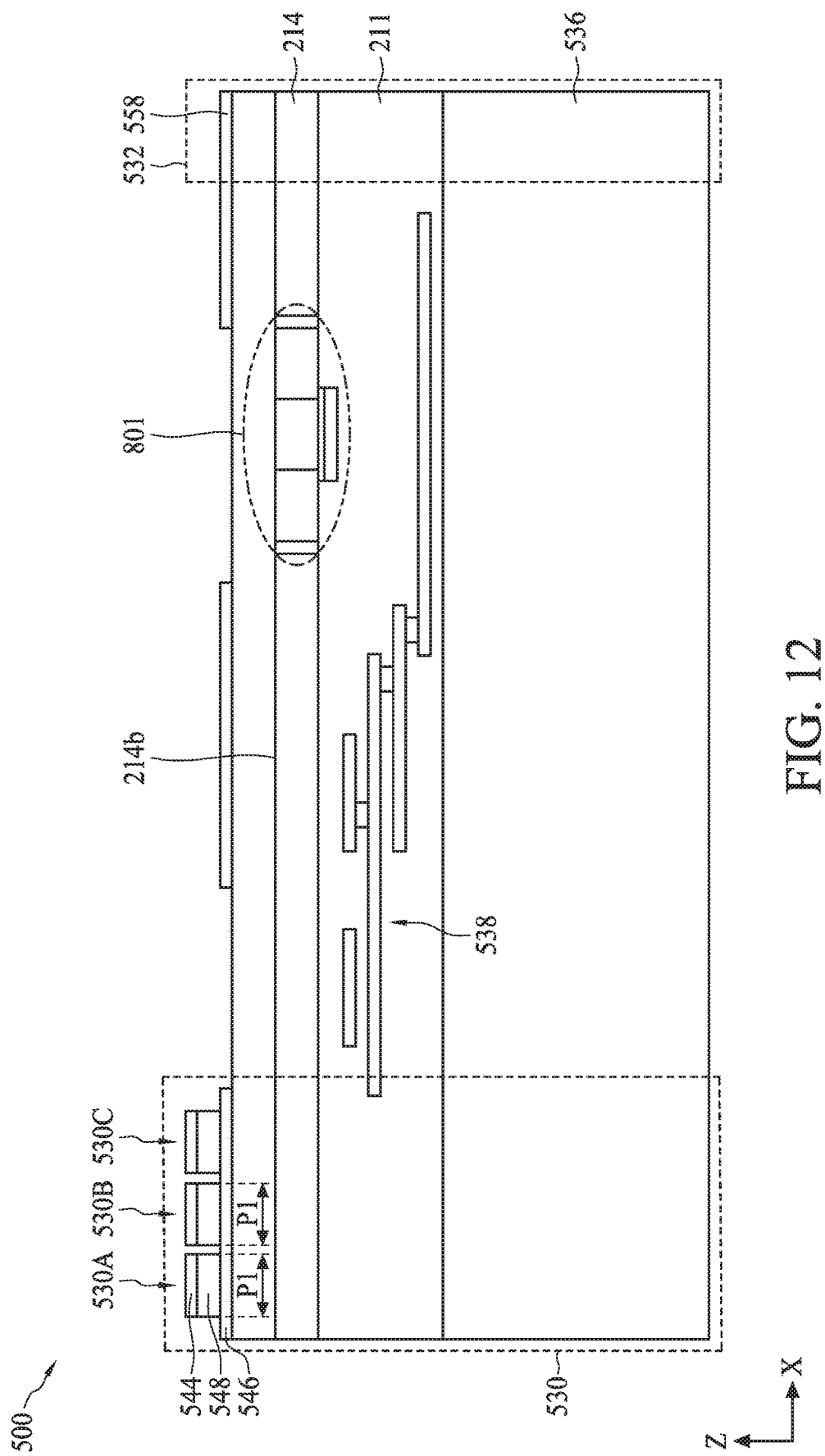

Referring to FIG. 12, bottom electrode 546, top electrodes 544, sensing material 548, and sensing electrode 558 can be formed after patterning and etching the conductive material layers 544* and 546* and layer 548*. The etching process can include a lift-off process, ion beam etching, reactive ion etching, wet etching, or any combinations thereof. In some embodiments, the etching process can be performed at a temperature ranging from room temperature (e.g., 27° C.) to about 100° C. In some embodiments, each sensing material 548 can be disposed on bottom electrode 546 at a pitch distance $P_1$ of about 1 μm to about 500 μm.

Referring to FIG. 7, in operation 715, a sensing well is formed on the back-side of the semiconductor substrate. For example, as described with reference to FIGS. 13-15, sensing well 213 can be formed on back-side 214b of semiconductor substrate 214. The process for forming sensing well 213 can include (i) forming opening 212, (ii) depositing a high-k dielectric material layer 224*, and (iii) patterning and etching of layer 224*. Opening 212 can be formed by patterning and etching a portion of isolation layer 210 overlying FET 801 on back-side 214b to expose channel region 208 and portions of source region 204 and drain region 206. The patterning and etching of the portion of isolation layer 210 can include using photolithography processes followed by an etching process, such as a dry etch, wet etch, plasma etch, and/or combinations thereof. In some embodiments, the patterning and etching processes can include forming opening 212 with a horizontal dimension along an X-axis in a range from about 5 nm to about 5 mm.

Figure 13:
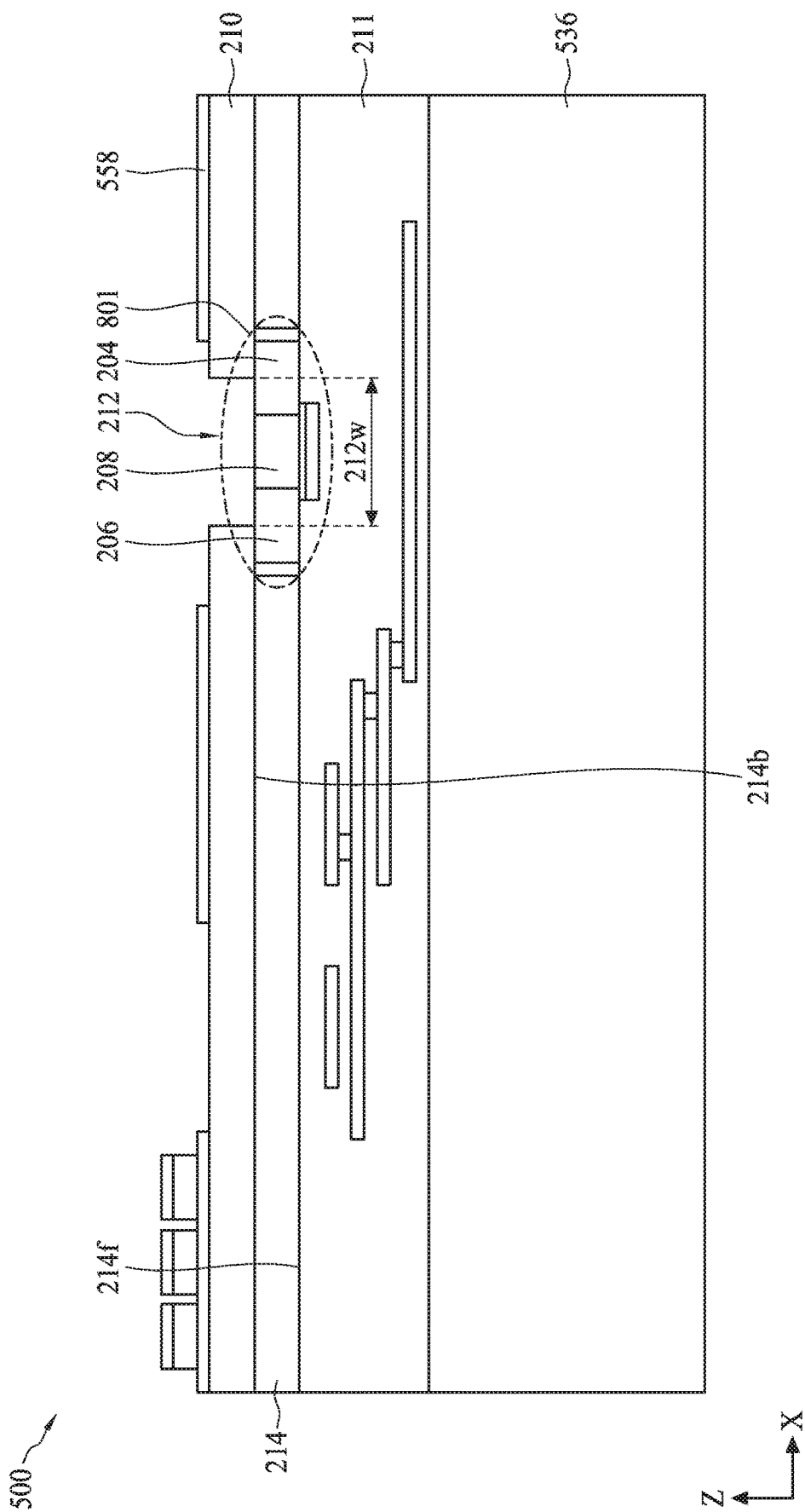
Figure 14:
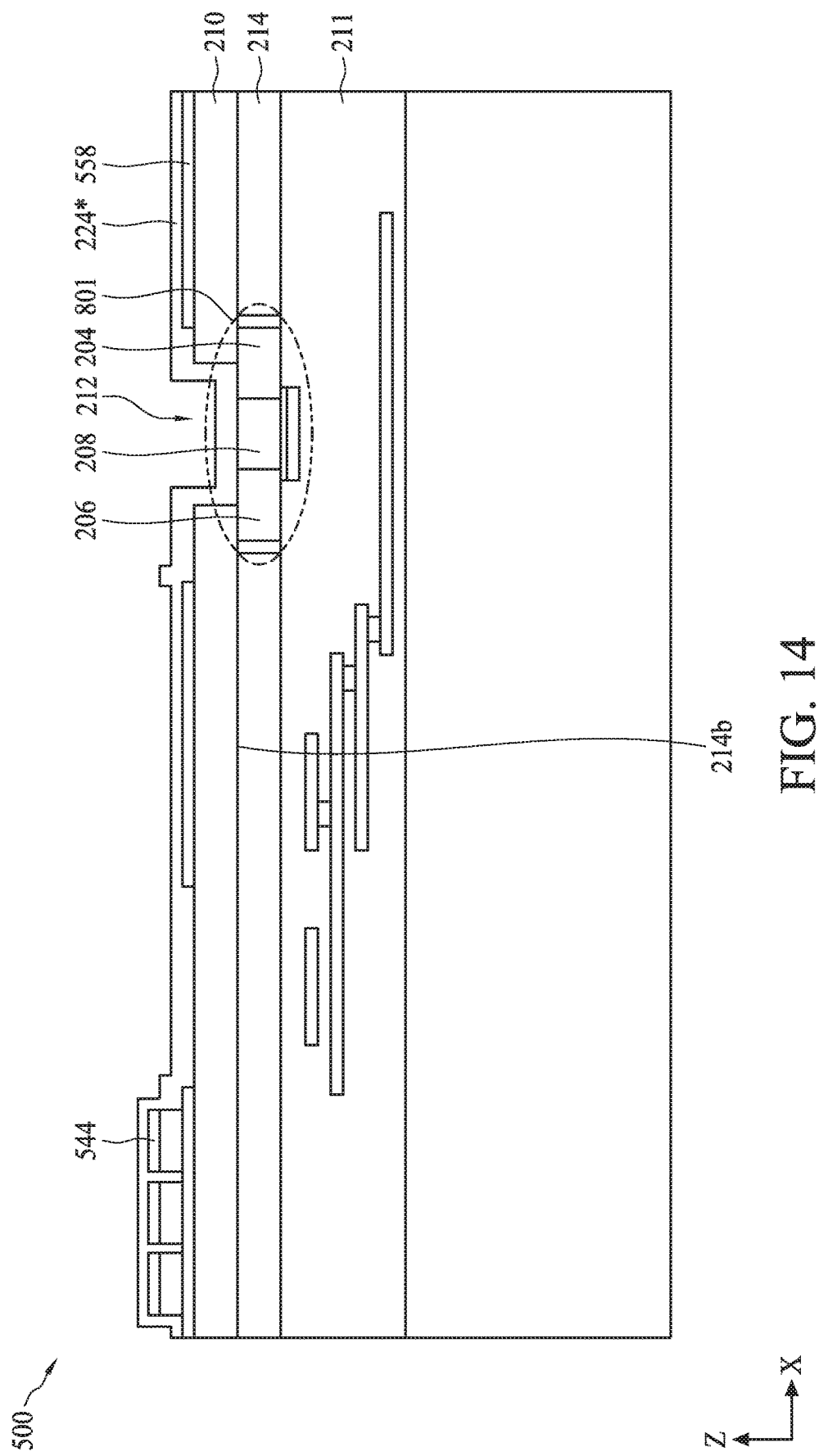

Referring to FIG. 14, following the forming of opening 212, high-k dielectric material layer 224* can be blanket deposited on the structure of FIG. 13. The blanket depositing can include depositing a high-k material, such as $HfO_2$, $TiO_2$, HfZrO, $Ta_2O_3$, $HfSiO_4$, $ZrO_2$, $ZrSiO_2$, $SiO_2$, SiN, $Y_2O_3$, $La_2O_3$, or any combinations thereof, using a deposition method, such as PVD, CVD, or ALD. In some embodiments, the blanket depositing can further include depositing high-k dielectric material layer 224* with a vertical dimension along a Z-axis in a range from about 1 nm to about 100 nm.

Figure 15:
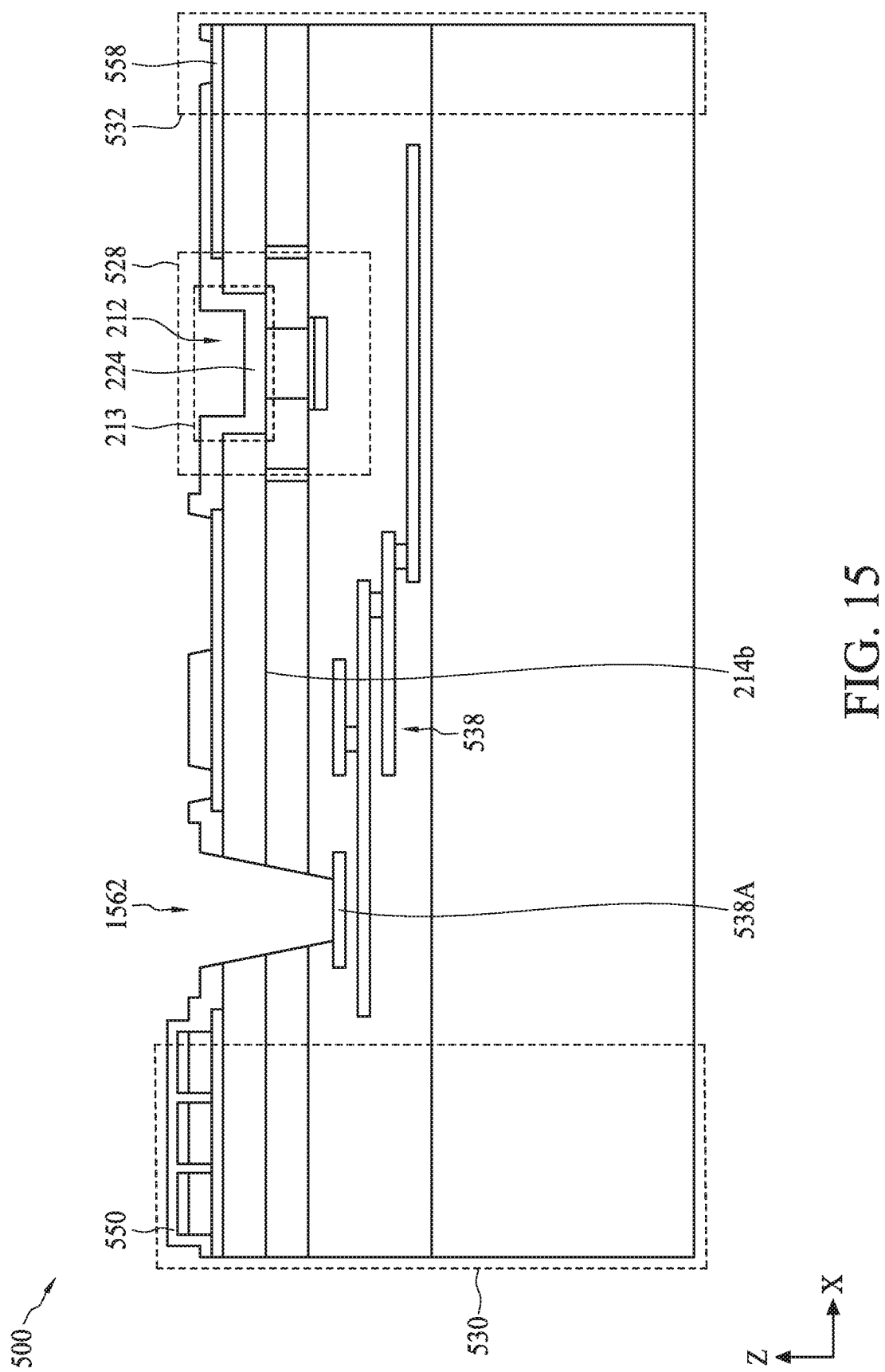
Figure 16:
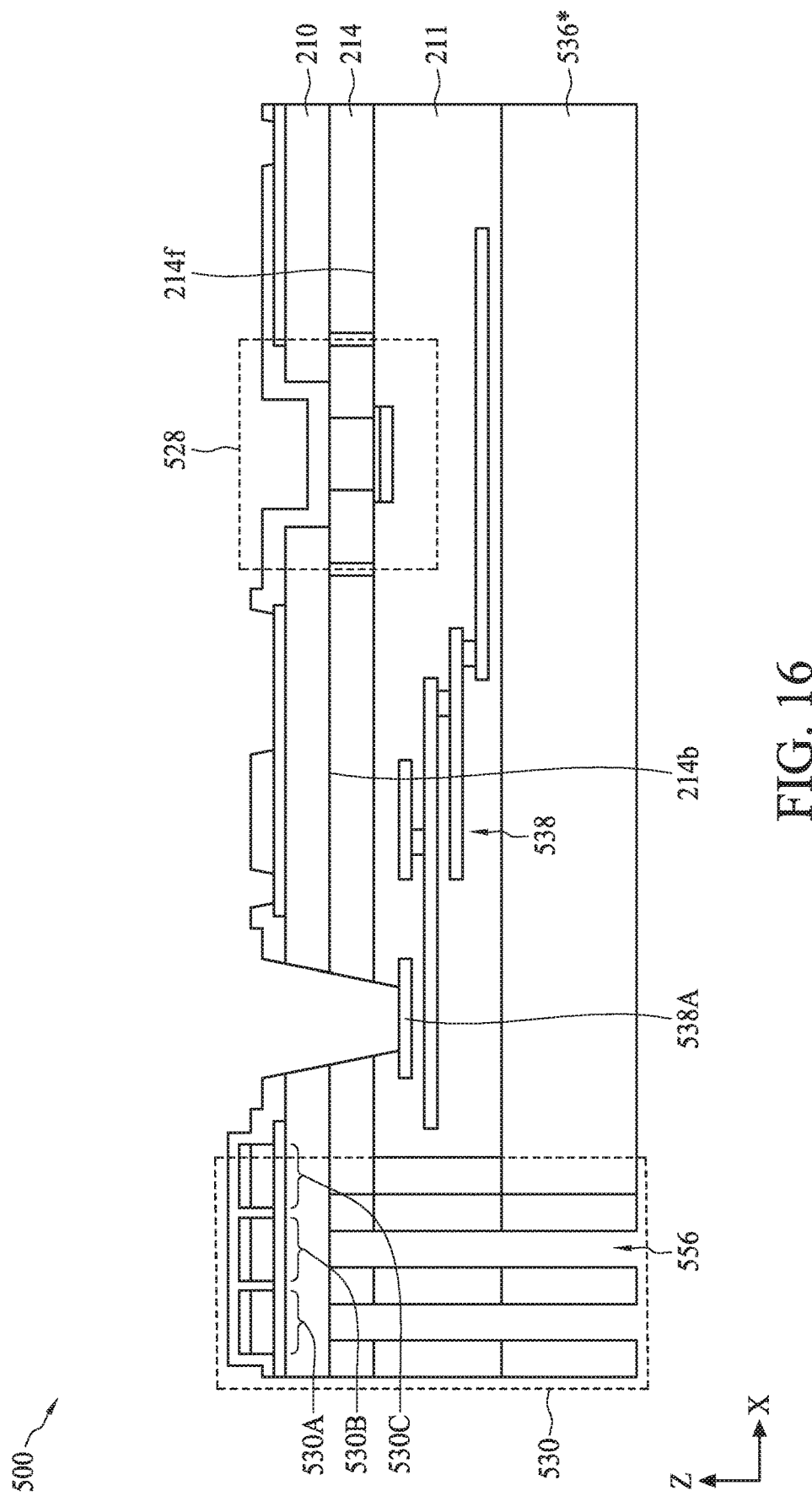

Referring to FIG. 15, the patterning and etching of high-k dielectric material layer 224* can simultaneously form sensing well 213 of bioFET sensor 528 and sensing layer 550 of biometric fingerprint sensor 530. The etching process can include a lift-off process, ion beam etching, reactive ion etching, wet etching, or any combinations thereof. In some embodiments, the etching process can be performed at a temperature ranging from room temperature (e.g., 27° C.) to about 100° C.

As shown in FIG. 15, bioFET sensor 528, biometric fingerprint sensor 530, and temperature sensor 532 can be simultaneously formed at the end of operation 715. Such simultaneous formation of different sensors in a semiconductor device can reduce the number of process steps compared to the number of process steps required if the fabrication processes of theses sensors are not integrated. Thus, integration of the sensor fabrication processes can reduce manufacturing cost and improve manufacturing yield.

Referring to FIG. 7, in operation 720, a contact opening is formed on the MLI structure. For example, as described with reference to FIG. 15, a contact opening 1562 can be formed on MLI structure 538. Contact opening 1562 can formed by patterning and etching portions of layers (e.g., isolation layer 210, semiconductor substrate 214, and/or ILD layer 211) overlying a conductive line 538A of MLI structure 538. The patterning process can include using photolithography processes followed by suitable wet, dry or plasma etching processes. In some embodiments, the etching process can include a lift-off process, ion beam etching, reactive ion etching, wet etching, or any combinations thereof. In some embodiments, the etching process can be performed at a temperature ranging from room temperature (e.g., 27° C.) to about 100° C.

Referring to FIG. 7, in operation 725, an array of cavities are formed on a back-side of the biometric fingerprint sensor and a cover plate is deposited on the sensor regions. For example, as described with reference to FIGS. 16-17, array of cavities 556 can be formed on back-side of biometric fingerprint sensor 530, and cover plate 554 can be formed on coupling layer 552 disposed on sensor regions 530A-530C.

The array of cavities 556 can be formed by thinning carrier substrate 536 to form carrier substrate 536* followed by an etching process to remove portions of carrier substrate 536*, ILD layer 211, and semiconductor substrate 214 underlying corresponding sensor regions 530A-530C. Each cavity 556 can be substantially aligned to each of sensor regions 530A-530C.

The thinning process can include a grinding process, a polishing process, and/or an etching process performed on surface 536a of carrier substrate 536 (FIG. 15) to form carrier substrate 536* (FIG. 16) with its vertical dimension along a Z-axis reduced by about 100 μm to about 600 μm compared to the vertical dimension of carrier substrate 536. In some embodiments, carrier substrate 536 can be thinned down by using a grinding process, followed by a polishing process, and then an etching process. Following the thinning process, the array of cavities 556 can be formed by etching the portions of carrier substrate 536*, ILD layer 211, and semiconductor substrate 214 underlying the corresponding sensor regions 530A-530C with a deep reaction ion etching. In some embodiments, each cavity 556 can have a vertical dimension along a Z-axis in a range from about 300 μm to about 1000 μm and a horizontal dimension along an X-axis in a range from about 1 μm to about 500 μm.

Figure 17:
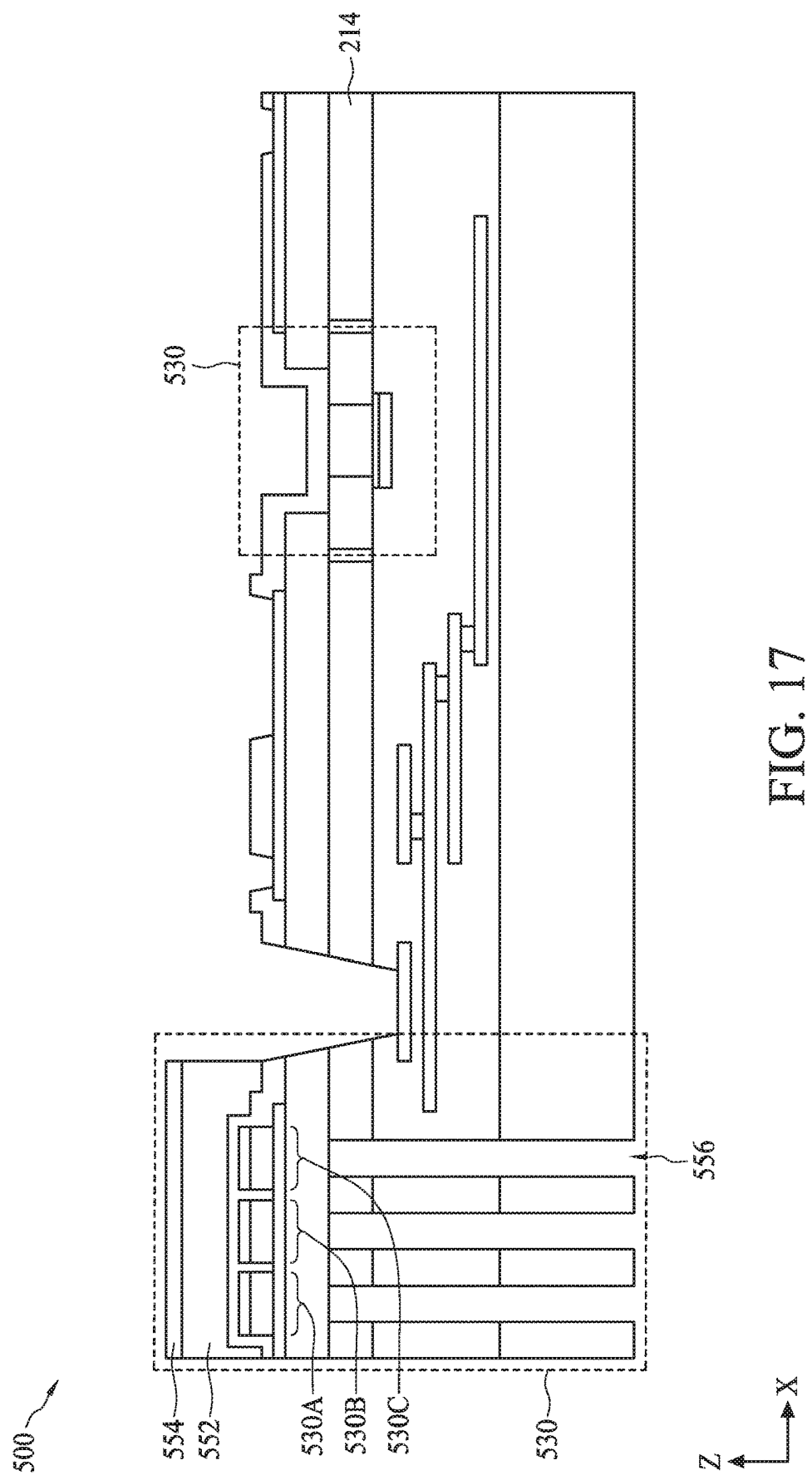
Figure 18:
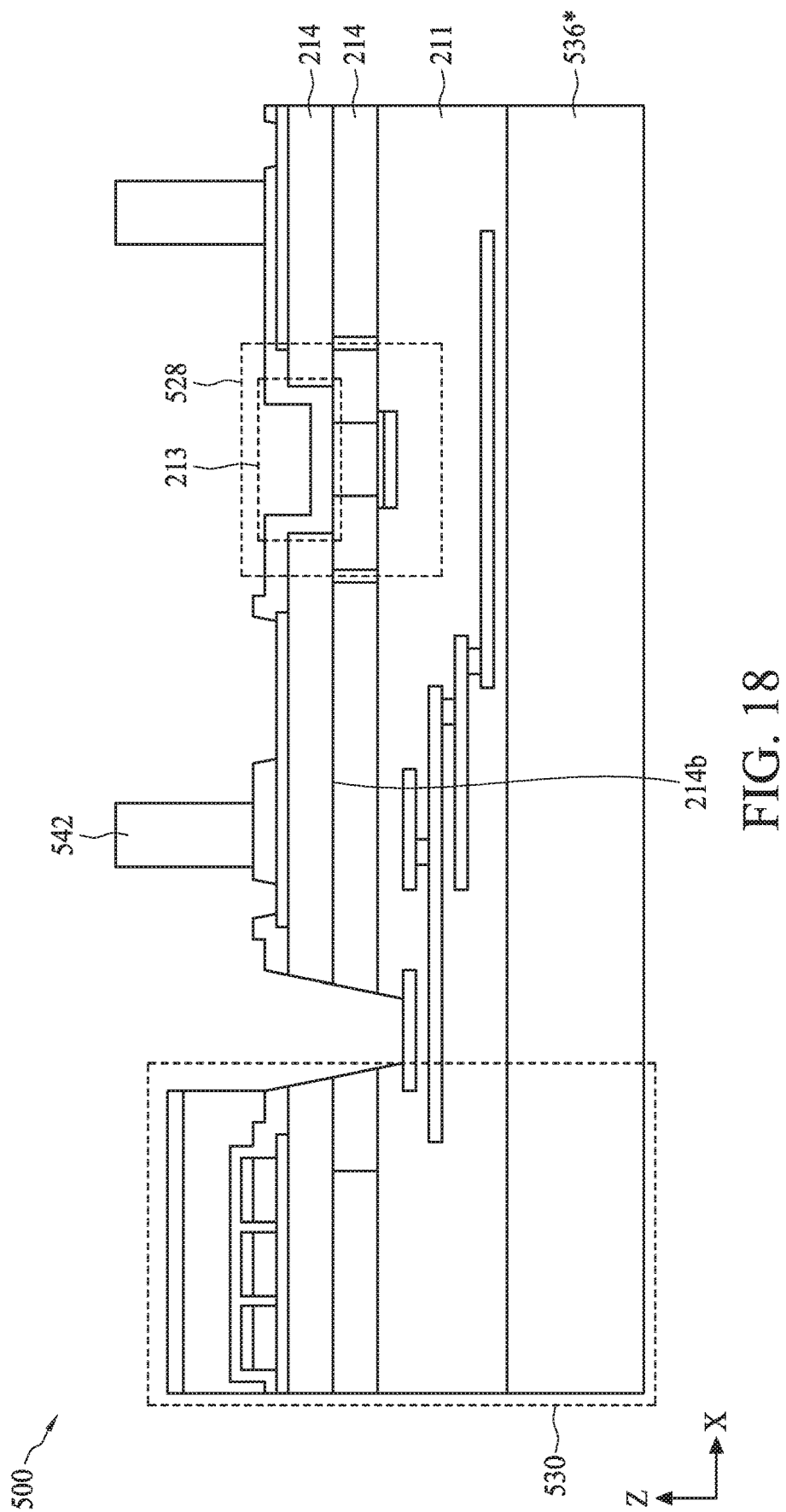

Referring to FIG. 17, following the etching process, coupling layer 552 and cover plat 554 can be selectively deposited on insulating layer 550 using an embossing process or a glue bonding process. Coupling layer 552 can include a polymeric material and can have a vertical dimension along a Z-axis in a range from about 1 μm to about 1000 μm. Cover plate 554 can include sapphire glass or other suitable protective material for protecting coupling layer 552 when pressure applied (e.g., by the user's fingerprint) on biometric fingerprint sensor 530. In some embodiments, cover plate 554 can have a vertical dimension along a Z-axis in a range from about 1000 μm to about 40000 μm.

In some embodiments, operation 725 can be optional and operation 720 can be followed by operation 730.

Referring to FIG. 7, in operation 730, a microfluidic channel is formed around the sensing well. For example, as described with reference to FIG. 18, microfluidic channel 542 can be formed on back-side 214b of semiconductor substrate 214 and around sensing well 213. The process for forming microfluidic channel 542 can include soft lithography using polydimethylsiloxane (PDMS), wafer bonding methods, and/or other suitable methods.

General Biological Applications

BioFETs of the present disclosure can be used to determine the presence or absence of a target analyte. In some aspects, the bioFETs can detect and measure absolute or relative concentrations of one or more target analytes. The bioFETs can also be used to determine static and/or dynamic levels and/or concentrations of one or more target analytes, providing valuable information in connection with biological and chemical processes. The bioFETs can further be used to monitor enzymatic reactions and/or non-enzymatic interactions including, but not limited to, binding. As an example, the bioFETs can be used to monitor enzymatic reactions in which substrates and/or reagents are consumed and/or reaction intermediates, byproducts, and/or products are generated. An example of a reaction that can be monitored using a bioFET of the present disclosure is nucleic acid synthesis to, for example, ascertain nucleic acid sequence.

Types of target analytes for use in the embodiments of the present disclosure can be of any nature provided there exists a capture reagent that binds to it selectively and in some instances specifically. Target analytes can be present in the test sample or, for example, generated following contact of the test sample with the sensing layer of a dual gate back-side sensing bioFET or with other reagents in the solution in contact with the sensing layer of a dual gate back-side sensing bioFET. Thus, types of target analytes include, but are not limited to, hydrogen ions (protons) or other ionic species, non-ionic molecules or compounds, metals, metal coordination compounds, nucleic acids, proteins, lipids, polysaccharides, and small chemical compounds such as sugars, drugs, pharmaceuticals, chemical combinatorial library compounds, and the like. Target analytes can be naturally occurring or can be synthesized in vivo or in vitro. Target analytes can indicate that a reaction or interaction has occurred, or indicate the progression thereof. Target analytes measured by a bioFET according to the present disclosure are not, however, limited and can include any of a variety of biological or chemical substances that provide relevant information regarding a biological or chemical process (e.g., binding events such as nucleic acid hybridization and other nucleic acid interactions, protein-nucleic acid binding, protein-protein binding, antigen-antibody binding, receptor-ligand binding, enzyme-substrate binding, enzyme-inhibitor binding, cell stimulation and/or triggering, interactions of cells or tissues with compounds such as pharmaceutical candidates, and the like). It is to be understood that the present disclosure further contemplates detection of target analytes in the absence of a receptor, for example, detection of PPi and Pi in the absence of PPi or Pi receptors. Any binding or hybridization event that causes a change to the transconductance of the dual gate back-side sensing bioFET changes the current that flows from the drain to the source of the sensors described herein and can be detected according to some embodiments.

For detection of various target analytes, the sensing surfaces of the dual gate back-side sensing bioFETs of the present disclosure can be coated with a capture reagent for the target analyte that binds selectively to the target analyte of interest or in some instances to a genus of analytes to which the target analyte belongs. A capture reagent that binds selectively to a target analyte is a molecule that binds preferentially to that analyte (i.e., its binding affinity for that analyte is greater than its binding affinity for any other analyte). Binding affinities for the analyte of interest can be at least about 2-fold, at least about 3-fold, at least about 4-fold, at least about 5-fold, at least about 6-fold, at least about 7-fold, at least about 8-fold, at least about 9-fold, at least about 10-fold, at least about 15-fold, at least about 20-fold, at least about 25-fold, at least about 30-fold, at least about 40-fold, at least about 50-fold, at least about 100-fold, at least about 500-fold, or at least about 1000-fold more than its binding affinity for any other analyte. In addition to relative binding affinity, the capture reagent has an absolute binding affinity that is sufficiently high to efficiently bind the target analyte of interest (i.e., it has a sufficient sensitivity). Capture reagents for use in the methods and systems of the present disclosure can have binding affinities in the femtomolar, picomolar, nanomolar, or micromolar ranges and can be reversible.

The capture reagent can be of any nature (e.g., a chemical, a nucleic acid, a peptide, a lipid, or a combination thereof). The present disclosure contemplates capture reagents that are ionophores, which bind selectively to an ionic species, whether anionic or cationic. In some embodiments, an ionophore is the capture reagent and the ion to which it binds is the target analyte. Ionophores include art-recognized carrier ionophores (i.e., small lipid-soluble molecules that bind to a particular ion) derived from, for example, a microorganism. In some embodiments, the capture reagent is polysiloxane, valinomycin, or salinomycin and the ion to which it binds is potassium. In some embodiments, the capture reagent is monensin, nystatin, or SQI-Pr, and the ion to which it binds is sodium. And in other embodiments, the capture reagent is ionomycin, calcimycine (A23187), or CA 1001 (ETH 1001), and the ion to which it binds is calcium. In other aspects, the present disclosure contemplates capture reagents that bind to more than one ion. For example, beauvericin can be used to detect calcium and/or barium ions, nigericin can be used to detect potassium, hydrogen and/or lead ions, and gramicidin can be used to detect hydrogen, sodium, and/or potassium ions.

Test samples can be from a naturally occurring source or can be non-naturally occurring. Naturally-occurring test samples include, without limitation, bodily fluids, cells, or tissues to be analyzed for diagnostic, prognostic and/or therapeutic purposes. The test sample can include any of cells, nucleic acids, proteins, sugars, lipids, and the like. In various embodiments, test samples can include chemical or biological libraries to be screened for the presence of agents with particular structural or functional attributes. Samples can be a liquid or dissolved in a liquid and of small volume and, as such, are amenable to high-speed, high-density analysis such as analyte detection using microfluidics.

Examples of bioFETs contemplated by various embodiments discussed herein include, but are not limited to, chemical FETS (chemFETs), ion sensitive FETs (ISFETs), immunologic FETs (ImmunoFETs), genetic FETs (GenFETs or DNA-FETs), enzyme FETs (EnFETs), receptor FETs, cell-based FETs, cell-free FETs, and liquid biopsy FETs. Thus, the bioFETs described herein can be used to detect target analytes with capture reagents and, as such, define the bioFET type that are not mutually exclusive. As a non-limiting example, a liquid biopsy FET can detect cell-free DNA and can also be referred to as a cell-free FET or a DNA-FET. See, e.g., Sakata et al. "Potentiometric Detection of Single Nucleotide Polymorphism by Using a Genetic Field-effect transistor," *Chembiochem* 6 (2005): 703-10; Uslu et al. "Labelfree fully electronic nucleic acid detection system based on a field-effect transistor device," *Biosens Bioelectron* 19 (2004): 1723-31; Sakurai et al. "Real-time monitoring of DNA polymerase reactions by a micro ISFET pH sensor," *Anal Chem* 64.17 (1992): 1996-1997.

For example, some embodiments provide a method for detecting a nucleic acid that includes contacting probe nucleic acids bound to a surface of a back-side sensing layer of a dual gate back-side sensing bioFET with a sample and detecting binding of a nucleic acid from the sample to one or more regions of the probe nucleic acids. Such a nucleic acid detecting bioFET can also be referred to as a GenFET or DNA-FET.

In other aspects, some embodiments provide a method for detecting a protein that includes contacting probe protein molecules bound to a surface of a back-side sensing layer of a dual gate back-side sensing bioFET with a sample and detecting binding of a protein from the sample to one or more regions of the probe protein molecules. GenFETs and DNA-FETs can be used to detect the protein.

In other aspects, some embodiments provide a method for detecting a nucleic acid that includes contacting probe protein molecules bound to a surface of a back-side sensing layer of a dual gate back-side sensing bioFET with a sample and detecting binding of a nucleic acid from the sample to one or more regions of the probe protein molecules. In yet other aspects, some embodiments provide a method for detecting an antigen that includes contacting probe antibodies bound to a back-side sensing layer of a dual gate back-side sensing bioFET with a sample and detecting binding of an antigen from the sample to one or more regions of the probe antibodies. Such protein or antibody binding bioFETs can also be referred to as ImmunoFETs.

In other aspects, some embodiments provide a method for detecting an enzyme substrate or inhibitor that includes contacting probe enzymes bound to a surface of a back-side sensing layer of a dual gate back-side sensing bioFET with a sample and detecting binding of an entity from (or generation of an enzymatic product in) the sample to one or more regions of the probe enzymes. In yet other aspects, some embodiments provide a method for detecting an enzyme that includes contacting enzyme substrates or inhibitors bound to a surface of a back-side sensing layer of a dual gate back-side sensing bioFET with a sample and detecting binding of an entity from (or generation of an enzymatic product in) the sample to one or more of the enzyme substrates or inhibitors. Such an enzyme based bioFET can also be referred to as an EnFET.

In other aspects, some embodiments provide a method for detecting protein-small molecule (e.g., organic compound) interactions that includes contacting small molecules bound to a surface of a back-side sensing layer of a dual gate back-side sensing bioFET with a sample and detecting binding of proteins from the sample to one or more regions of the probe small molecules. In yet other aspects, some embodiments provide a method for detecting nucleic acid-small-molecule (e.g., organic compound) interactions that includes contacting small molecules bound to a surface of a back-side sensing layer of a dual gate back-side sensing bioFET with a sample and detecting binding of nucleic acids from the sample to one or more regions of the probe small molecules. In either detection method, the sample can include small molecules and the capture reagents bound to the surface of the back-side sensing layer can be either nucleic acids or proteins. In other aspects, the target analytes of interest are heavy metals and other environmental pollutants, and/or the bioFET arrays are specifically configured to detect the presence of different pollutants. Such small molecule or chemical-sensing bioFETs can also be referred to as chemFETs.

In other aspects, some embodiments provide a method for detecting hydrogen ions and/or changes in H+ concentration (i.e., changes in pH). Such ion-sensing bioFETs can also be referred to as ISFETs.

The systems and methods described herein can also be used to aid in the identification and treatment of disease. For example, some embodiments provide a method for identifying a sequence associated with a particular disease or for identifying a sequence associated with a response to a particular active ingredient or treatment or prophylactic agent that includes contacting a capture reagent (e.g., a nucleic acid probe) bound to a surface of a back-side sensing layer of a dual gate back-side sensing bioFET with a sample, and detecting binding of nucleic acids (e.g., including a variant or lacking nucleic acids otherwise contained in a corresponding wild-type nucleic acid sequence) from the sample to one or more regions of the capture reagent. Such bioFETs can also be referred to as GenFETs, DNA-FETs, or liquid biopsy FETs.

Further Applications

Several additional applications of the dual gate back-side sensing bioFETs described herein are contemplated. For example, the sensing layer of a dual gate back-side sensing bioFET provides real-time, label-free quantification and analysis for a variety of biological, chemical, and other applications including, but not limited to, gene expression analysis, comparative genome hybridization (CGH), array-based exon enrichment processes, protein sequencing, tissue microarrays, and cell culture. In some embodiments, the dual gate back-side sensing bioFET can be used to screen samples including, but not limited to, bodily fluids and/or tissues such as blood, urine, saliva, CSF, or lavages or environmental samples such as water supply samples or air samples, for the presence or absence of a substance. For example, the arrays can be used to determine the presence or absence of pathogens (e.g., food-borne or infectious pathogens) such as viruses, bacteria, or parasites based on target genomic, proteomic, and/or other elements. The arrays can also be used to identify the presence or absence or characterize cancer cells or cells that are indicative of another condition or disorder, in a subject. Additional applications for use of the dual gate back-side sensing bioFETs described herein include those described in U.S. Pat. No. 8,349,167 (Gene expression analysis, comparative genome hybridization (CGH), array-based exon enrichment processes); U.S. Pat. No. 8,682,592 (Non-Invasive Prenatal Diagnosis (NIPD), DNA/RNA contamination, SNP identification); U.S. Pat. No. 9,096,899 (Method of amplifying and sequencing DNA within a flow cell is provided); U.S. Pat. No. 9,340,830 (Analyzing a tumor sample); U.S. Pat. No. 9,329,173 (Automated system for testing for *Salmonella enterica* bacteria); U.S. Pat. No. 9,341,529 (Method for manufacturing a pressure sensor); U.S. Pub. Appl. Nos. 2015/0353920; 2015/0355129 (Chemical and biological substances detection in bodily fluid); 2016/0054312 (Chemically differentiated sensor array for sample analysis); 2016/0040245 (Identification and molecular characterization of the CTCs associated with neuroendocrine prostate cancer (NEPC).

In some embodiments, the dual gate back-side sensing bioFETs can be used to obtain single cell gene expression profiles from one or more cells in a cellular sample of interest, for example, in heterogeneous cellular samples. Such samples often exhibit a high degree of variation in their gene/biomarker expression levels (e.g., due to the cell cycle, environment, and stochastic mechanism of transcription/translation), even among individual cells that have the same phenotype. The dual gate back-side sensing bioFETs enable interrogation of the expression profile of each cell in the sample. In certain aspects, the subject methods for single-cell molecular profiling obviate the need for separating cells of interest from a heterogeneous cellular sample with individual profiling available at each dual gate back-side sensing bioFET. Direct molecular profiling in heterogeneous cell samples is advantageous for clinical diagnostic and biomarker discovery applications. In certain aspects, the dual gate back-side sensing bioFETs are used in molecular profiling and cellular subtyping of heterogeneous original or enriched disease tissue and biological fluid samples, for example, biopsy tumor samples, endothelial cells from cardiovascular disease samples, bone marrow samples, lymph node samples, lymph, amniotic fluid, brain samples from different neurological disorders, lung pathological samples, and/or any other heterogeneous disease tissue sample of interest. Thus, for example, the dual gate back-side sensing bioFETs are used in the molecular profiling of normal biological tissue and biological fluid samples, to elucidate, for example, the mechanisms of differentiation, immune responses, cell-cell communication, or brain development.

In some embodiments, the dual gate back-side sensing bioFETs are used in obtaining single cell expression profiles in circulating tumor cells (CTCs). CTCs can derive from metastases and can recirculate through the bloodstream and lymph to colonize distinct organs and/or the primary tumor, giving rise to secondary metastasis. CTCs play a critical role in the metastatic spread of carcinomas. Therefore, detection of CTCs in blood (liquid biopsy) or disseminating tumor cells (DTC) in bone marrow can be used to monitor tumor staging and would improve the identification, diagnosis, and treatment of cancer patients at high risk of metastatic relapse. See, e.g., U.S. Pat. No. 9,340,830 (Col. 205, lines 61-64); U.S. Pat. No. 9,447,411 (Col. 21, lines 42-54); U.S. Pat. No. 9,212,977 (Col. 19, lines 56-67); U.S. Pat. No. 9,347,946 (Col. 9, lines 16-30). In some embodiments, the dual gate back-side sensing bioFETs are used to obtain expression and mutation profiles in a cellular sample that includes CTCs as well as non-target contaminating cell types (e.g., leukocytes). See, e.g., U.S. Pat. No. 9,340,830 (Col. 1, lines 41-67); U.S. Pat. No. 9,447,411 (Col. 2, lines 41-55); U.S. Pat. No. 9,212,977 (Col. 2, lines 48-67; Col. 3 lines 1-10); and U.S. Pat. No. 9,347,946 (Col. 9).

In other embodiments, the dual gate back-side sensing bioFETs described herein can provide point-of-care, portable, and/or real-time diagnostic tools. They can, for example, provide an electronic readout of an enzyme linked immunosorbent assay (ELISA) or other assays to detect various chemical or biological substances. The dual gate back-side sensing bioFETs can be configured to transduce or convert a biochemical binding event or reaction into an electrical signal, which can be read out. Indirect detection of a freely diffusing, electronically active species produced at the site of a bound chemical or biological substance can be performed utilizing the dual gate back-side sensing bioFETs. Electronic readout ELISA schemes where an enzyme capable of producing an electronically active species can be used. In some embodiments, riboswitches are used to detect metabolites. See, e.g., Mironov, Alexander S., et al., "Sensing small molecules by nascent RNA: a mechanism to control transcription in bacteria." Cell 111.5 (2002): 747-756; Winkler, Wade, Ali Nahvi, and Ronald R. Breaker, "Thiamine derivatives bind messenger RNAs directly to regulate bacterial gene expression." Nature 419.6910 (2002): 952-956. In some embodiments, the dual gate back-side sensing bioFET arrays are used to measure the kinetics of a reaction and/or compare the activities of enzymes, including substrates, a co-factor, or another moiety for readout.

Other applications for the dual gate back-side sensing bioFET arrays involve the use of molecular recognition sites, where molecules that specifically recognize particular target molecules are either identified or designed and applied to the surface of the array. Previous work with chemFETs has demonstrated the ability of single individual ISFETs to recognize ions such as potassium.

In some embodiments, the dual gate back-side sensing bioFET is used to monitor the presence and/or amount of specific molecules including, for example, environmental testing of specific toxins and important elements. Such testing can use molecular recognition sites to measure both pollution gases and particulate contamination, where molecules that specifically recognize particular target molecules are either identified or designed and applied to the surface of the array. See, e.g., Brzozka et al. "Enhanced performance of potassium CHEMFETs by optimization of a polysiloxane membrane," Sensors and Actuators B. Chemical 18, 38-41 (1994); Sibbald et al. "A miniature flow-through cell with a four-function ChemFET integrated circuit for simultaneous measurements of potassium, hydrogen, calcium and sodium ions," Analytica Chimica Acta. 159, 47-62 (1984); Cobben et al. "Transduction of selective recognition of heavy metal ions by chemically modified field effect transistors (CHEMFETs)," Journal of the American Chemical Society 114, 10573-10582 (1992). In some embodiments, the dual gate back-side sensing bioFET can be used with a personal, portable, and wearable detector system. This system can act as an early warning device indicating to the user that the pollution levels in their current local environment is at a level that could cause the user some discomfort or even lead to breathing problems. This is particularly relevant to people suffering from respiratory or bronchial or asthma conditions, where the user needs to take necessary precautions. The dual gate back-side sensing bioFET has the capability of detecting individual gases, such as NOx, $SO_2$ and/or CO, and/or monitoring temperature and humidity. See U.S. Pub. Appl. Nos. 2014/0361901; 2016/0116434 (Paragraph [0117]). The pollution sensors can, for example, be referred to as a gas field effective transistor (gasFET). A gasFET can contain, for example, an FET with a gate metallization exposed to the surrounding atmosphere. When a gas is absorbed on the surface, protons can diffuse to the metal gas interface. This results in a dipole layer which affects the threshold voltage of the device.

In some embodiments, the dual gate back-side sensing bioFET can be used in vivo by introduction into a subject (e.g., in the brain or other region that is subject to ion flux) and then analyzing for changes. For example, electrical activity of cells can be detected by ionic flow. Thus, a bioFET array can be integrated onto a novel ion-discriminating tissue probe. Other applications include, for example, cochlear prosthesis and retinal and cortical implants. See, e.g., Humayun et al. Vision Research 43, 2573-2581 (2003); Normann et al. Vision Research 39, 2577-2587 (1999).

FINAL REMARKS

The present disclosure provides example structures of a semiconductor device (e.g., semiconductor device 500) with an array of bioFET sensors (e.g., sensor 528), a biometric fingerprint sensor (e.g., sensor 530), and a temperature sensor (e.g., sensor 532) and example methods for fabricating the same. The biometric fingerprint sensor can be configured to authenticate the fingerprint pattern of a user and the bioFET sensor can be activated based on the fingerprint pattern authentication. Such authentication with the biometric fingerprint sensor can allow the user to have a personalized sensor system with the array of bioFET sensors for secure bio-sensing and/or secure transmission of bio-sensing measurements to the user's storage system (e.g., medical record systems or Health Savings Accounts (HSAs)). The temperature sensor can be configured to measure the temperature variations in the bioFET sensor during its operation, based on which the temperature of the bioFET sensor can be adjusted using a heater (e.g., heater 534).

The example method for fabricating the semiconductor device integrates the fabrication processes of the array of bioFET sensor, biometric fingerprint sensor, and temperature sensor, such that these sensors can be simultaneously formed on a carrier substrate. Such integration of the sensor fabrication processes can reduce the number of process steps and increase manufacturing yield.

According to some embodiments, a method for fabricating a semiconductor device includes forming a gate electrode on a first side of a semiconductor substrate, forming a channel region between source and drain regions within the semiconductor substrate, and forming a piezoelectric sensor region on a second side of the semiconductor substrate. The second side is substantially parallel and opposite to the first side. The method further includes forming a temperature sensing electrode on the second side during the forming of the piezoelectric sensor region, forming a sensing well on the channel region, and binding capture reagents on the sensing well.

According to some embodiments, a method for fabricating a semiconductor device includes forming a bioFET sensor and a biometric sensor on a carrier substrate. The method of forming the bioFET sensor includes forming a gate electrode on a first side of a semiconductor substrate disposed on the carrier substrate and forming a channel region between source and drain regions within the semiconductor substrate. The method of forming the biometric sensor includes forming a piezoelectric sensor region on a second side of the semiconductor substrate and depositing a sensing layer on the piezoelectric sensor region. The second side is substantially parallel and opposite to the first side.

According to some embodiments, a semiconductor device includes a gate electrode disposed on a first side of a semiconductor substrate, a channel region disposed between source and drain regions within the semiconductor substrate, and a piezoelectric sensor region disposed on a second side of the semiconductor substrate. The second side is substantially parallel and opposite to the first side. The semiconductor device further includes a temperature sensing electrode disposed on the second side, a sensing well disposed on the channel region, and capture reagents bound to the sensing well.

It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments but should be defined in accordance with the subjoined claims and their equivalents.

The foregoing disclosure outlines features of several embodiments so that those skilled in the art can better understand the aspects of the present disclosure. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions, and alterations herein without departing from the spirit and scope of the present disclosure.

What is claimed is:

1. A method for fabricating a semiconductor device, comprising:
   forming a gate electrode on a first side of a semiconductor substrate;
   forming a channel region between source and drain regions within the semiconductor substrate;
   forming a piezoelectric sensor region with a piezoelectric material on a second side of the semiconductor substrate, wherein the second side is substantially parallel and opposite to the first side;
   forming a temperature sensing electrode on the second side during the forming of the piezoelectric sensor region;
   forming a sensing well on the channel region; and
   binding capture reagents on the sensing well.

2. The method of claim 1, wherein the forming the piezoelectric sensor region comprises:
   depositing an isolation layer on the second side;
   depositing a first electrode on the isolation layer;
   depositing the piezoelectric material on the first electrode; and
   depositing a second electrode on the piezoelectric material.

3. The method of claim 1, wherein the forming the piezoelectric sensor region comprises forming an array of piezoelectric sensor regions with the piezoelectric material.

4. The method of claim 1, wherein the forming the piezoelectric sensor region comprises:
   depositing a first electrode on the second side;
   forming an array of piezoelectric regions with the piezoelectric material on the first electrode; and
   depositing an insulating layer between adjacent piezoelectric regions of the array of piezoelectric regions.

5. The method of claim 1, wherein the forming the piezoelectric sensor region comprises:
   depositing a layer of conductive material on the second side; and
   etching the layer of conductive material to simultaneously form a bottom electrode of the piezoelectric sensor region on a first region of the second side and the temperature sensing electrode on a second region of the second side.

6. The method of claim 1, wherein the forming the sensing well comprises:
   depositing an isolation layer on the second side;
   etching a portion of the isolation layer overlying the channel region to form an opening on the channel region;
   blanket depositing an insulating layer on the isolation layer, the channel region, and sidewalls of the opening; and
   etching the insulating layer to simultaneously form the sensing well on a first region of the second side and a sensing layer on a second region of the second side.

7. The method of claim 1, further comprising depositing a coupling layer on the piezoelectric sensor region.

8. The method of claim 1, further comprising forming a contact opening between the piezoelectric sensor region and the sensing well after the forming of the piezoelectric sensor region and the sensing well.

9. The method of claim 1, further comprising:
   forming an interconnect structure prior to the forming of the piezoelectric sensor region and the sensing well; and
   forming a contact opening on the interconnect structure and between the piezoelectric sensor region and the sensing well after the forming of the piezoelectric sensor region and the sensing well.

10. The method of claim 1, further comprising forming an interconnect structure prior to the forming of the piezoelectric sensor region and the sensing well; and
   forming a heater during the forming of the interconnect structure.

11. A method for fabricating a semiconductor device, comprising:

forming a bioFET sensor on a carrier substrate, wherein the forming the bioFET sensor comprises:
  forming a gate electrode on a first side of a semiconductor substrate disposed on the carrier substrate, and
  forming a channel region between source and drain regions within the semiconductor substrate; and
forming a biometric sensor on the carrier substrate, wherein the forming the biometric sensor comprises:
  forming a piezoelectric sensor region with a piezoelectric material on a second side of the semiconductor substrate, wherein the second side is substantially parallel and opposite to the first side; and
  depositing a sensing layer on the piezoelectric sensor region.

12. The method of claim 11, further comprising simultaneously forming a temperature sensor electrode on a first region of the second side and a bottom electrode of the piezoelectric sensor region on a second region of the second side.

13. The method of claim 11, further comprising simultaneously forming the sensing layer on a first region of the second side and a sensing well of the bioFET sensor on a second region of the second side.

14. The method of claim 11, wherein the forming the piezoelectric sensor region comprises forming an array of piezoelectric sensor regions with the piezoelectric material.

15. The method of claim 11, wherein the forming the piezoelectric sensor region comprises:
  depositing a first electrode on the second side;
  depositing an array of piezoelectric regions with the piezoelectric material on the first electrode; and
  depositing an array of second electrodes on the array of piezoelectric regions.

16. The method of claim 15, wherein the forming the biometric sensor comprises:
  coupling the first electrode to a ground voltage; and
  coupling the array of second electrodes to an array of voltage sources.

17. A method, comprising:
  forming a gate electrode on a first side of a semiconductor substrate;
  forming source and drain regions within the semiconductor substrate with a channel region disposed between the source and drain regions;
  forming a piezoelectric sensor region with a piezoelectric material on a second side of the semiconductor substrate, wherein the second side is substantially parallel and opposite to the first side; and
  depositing a sensing layer on the piezoelectric sensor region.

18. The method of claim 17, further comprising forming a contact region within the semiconductor substrate between the piezoelectric sensor region and the gate electrode.

19. The method of claim 17, further comprising forming an array of cavities under the piezoelectric sensor region.

20. The method of claim 17, wherein the forming the piezoelectric sensor region comprises forming an array of fingerprint sensing regions.

* * * * *